(12) United States Patent
Sgiarovello et al.

(10) Patent No.: US 10,340,197 B2
(45) Date of Patent: Jul. 2, 2019

(54) INTEGRATED CIRCUIT SUBSTRATE HAVING CONFIGURABLE CIRCUIT ELEMENTS

(71) Applicant: Infineon Technologies AG, Neubiberg (DE)

(72) Inventors: Claudia Sgiarovello, Villach (AT); Martin Mischitz, Wernberg (AT); Andrew Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/617,303

(22) Filed: Jun. 8, 2017

(65) Prior Publication Data

US 2017/0271216 A1  Sep. 21, 2017

Related U.S. Application Data

(63) Continuation of application No. 15/048,614, filed on Feb. 19, 2016, now Pat. No. 9,786,568.

(51) Int. Cl.
*H01L 21/66* (2006.01)
*H01L 21/768* (2006.01)
*H01L 23/525* (2006.01)

(52) U.S. Cl.
CPC ........ *H01L 22/20* (2013.01); *H01L 21/76886* (2013.01); *H01L 23/5256* (2013.01); *H01L 21/76877* (2013.01); *H01L 22/14* (2013.01); *H01L 23/5252* (2013.01)

(58) Field of Classification Search
CPC .................. H01L 21/67253; H01L 22/20; H01L 23/5222
See application file for complete search history.

(56) References Cited

U.S. PATENT DOCUMENTS

| | | | |
|---|---|---|---|
| 7,481,885 B2 * | 1/2009 | Shimizu | H01L 21/67271 118/313 |
| 8,324,657 B2 | 12/2012 | Shimizu et al. | |
| 8,890,338 B2 | 11/2014 | Harris | |
| 2001/0018231 A1 * | 8/2001 | Lin | H01L 24/50 438/108 |
| 2002/0111031 A1 | 8/2002 | Chase | |
| 2007/0202610 A1 | 8/2007 | Chiang | |
| 2009/0009196 A1 | 1/2009 | De Vries | |
| 2009/0294911 A1 * | 12/2009 | Pagaila | H01L 21/561 257/620 |

(Continued)

FOREIGN PATENT DOCUMENTS

| | | |
|---|---|---|
| JP | 2007-059785 | 3/2007 |
| JP | 2008-085342 | 4/2008 |
| JP | 2016009840 | 1/2016 |

*Primary Examiner* — Dung A. Le
(74) *Attorney, Agent, or Firm* — Dicke, Billig & Czaja, PLLC

(57) ABSTRACT

A die includes a plurality of dielectric landings and a conductive material distributed across one or more of the plurality of dielectric landings. Each one of the plurality of dielectric landings electrically separates two conductive landings associated with the one of the plurality of dielectric landings. The conductive material establishes an electrical connection between the two conductive landings associated with the one or more of the plurality of dielectric landings.

12 Claims, 14 Drawing Sheets

(56) References Cited

U.S. PATENT DOCUMENTS

| | | |
|---|---|---|
| 2010/0284128 A1 | 11/2010 | Kabe |
| 2012/0244644 A1 | 9/2012 | Wang |
| 2014/0210041 A1* | 7/2014 | Burke ............... H01L 23/53295 |
| | | 257/529 |
| 2015/0115329 A1 | 4/2015 | Lin et al. |

* cited by examiner

INTEGRATED CIRCUIT SUBSTRATE HAVING CONFIGURABLE CIRCUIT ELEMENTS

CROSS-REFERENCE TO RELATED APPLICATIONS

This Utility Patent Application is a continuation of U.S. patent application Ser. No. 15/048,614, filed on Feb. 19, 2016, which is incorporated herein by reference.

FIELD

The present disclosure relates to the manufacture of integrated circuit chips and, more particularly, to manufacture integrated circuit chips that have precise electrical properties.

BACKGROUND

Today, integrated circuit's sensors can require a level of precision which cannot be reached with current ultra large scale integration (ULSI) production techniques.

A conventional solution consists in measuring device deviations with respect to a target value once the wafer manufacturing is complete, and in compensating deviations accordingly via extra processing. Depending on the device type, different solutions are currently in use. For example, digital coding is adopted via fuse concepts with fine-tuning of the electrical characteristics of the product after its final electrical testing at wafer-level. For another example, current sensors are embedded in many ICs to insure constant monitoring and protection of the device during circuit start-up or malfunction. At least some effects of implementing the teaching disclosed herein are as follows: An alternative to conventional laser fuses is provided that enables use of fuses where a conventional laser fuse cannot be used thus opening the processing to a broader range of applications. During wafer processing, techniques that are disclosed herein allow to have chip-selective modifications provided on a wafer, whereby individual chips can be manufactured while using lithography masks designed for production of multiple non-individual chips on a same wafer.

At least some effects associated with the introduction of post-processing printed structures can be as follows: Conventional process technologies can be easily adapted or complemented according to some implementations so as to perform digital coding without necessitating Laser tools. Thus, negative effects typically associated with a use of conventional Laser such as alignment problems can be avoided.

SUMMARY

According to an embodiment of a method of manufacturing a wafer, the method includes providing a wafer that includes a plurality of semiconductor device structures and testing at least one of the plurality of semiconductor device structures. Based on a test result, a substance is provided on a selected portion of the wafer to selectively configure a circuit element within the at least one of the plurality of semiconductor device structures.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components will bear the same designations and numbering throughout the figures.

DETAILED DESCRIPTION

Below, embodiments, implementations and associated effects are disclosed with reference to the accompanying drawings.

Figure 1:
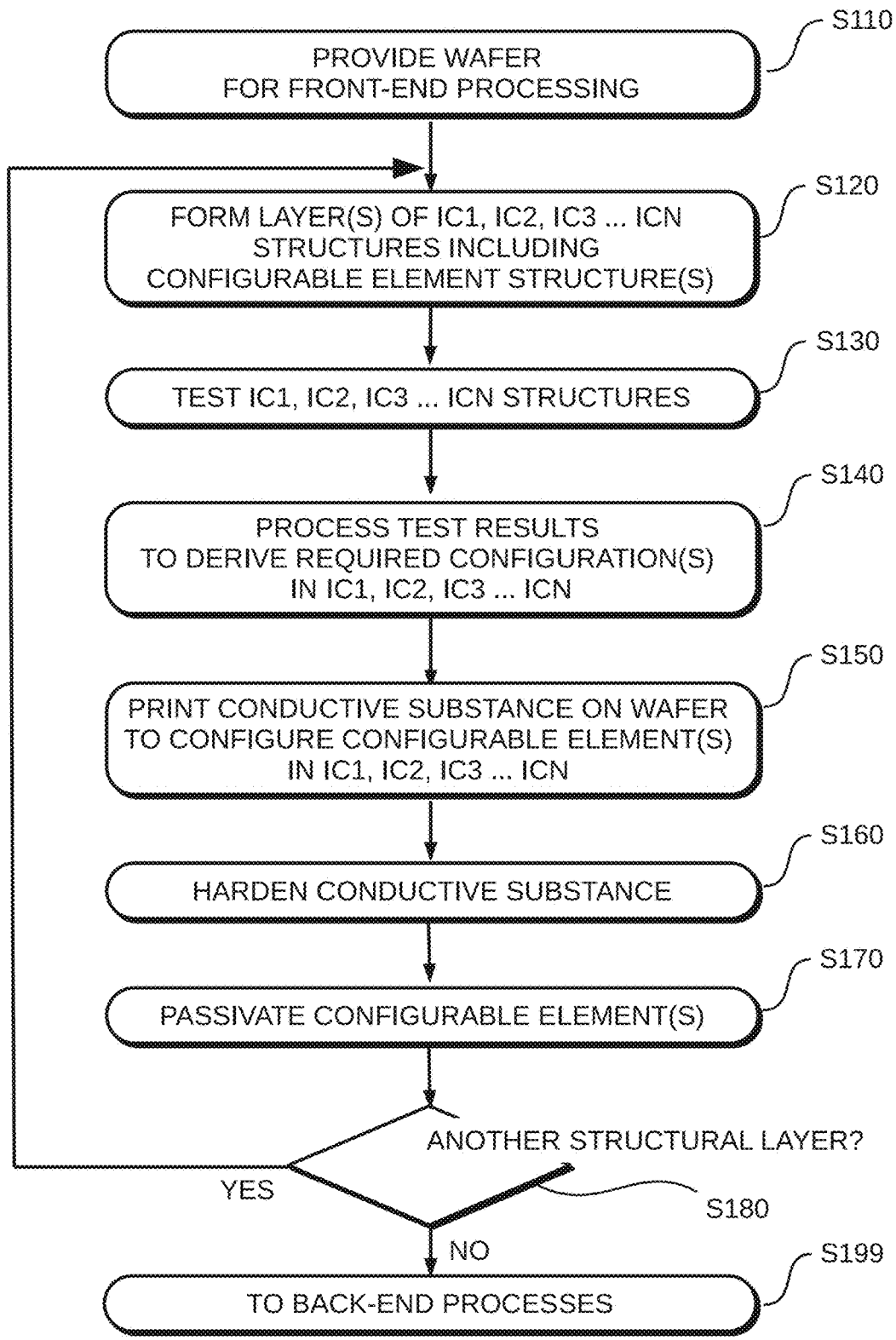
FIG. 1 illustrates a flowchart of a method according to some embodiments.

FIG. 1 illustrates a flowchart of a method according to some embodiments. The method can be used in manufacturing semiconductor device chips. In some embodiments, the semiconductor device chips can, for example, comprise each one or more integrated circuits. In some embodiments, the semiconductor device includes a power transistor. In some embodiments, the semiconductor device includes a sensor. In some embodiments at least two of the aforementioned elements are combined in the semiconductor device chip.

At S110, the method comprises providing a wafer comprising a plurality of semiconductor device structures. The wafer can generally be provided for front-end processing as known in the art. In some embodiments, semiconductor device structures form a portion of an integrated circuit. The semiconductor device structures can be configured to form passive circuit elements such as resistance, inductance and capacitance. Further, the semiconductor device structures can be configured to form active circuit elements such as transistors. The skilled person will understand that, where the semiconductor device structure is provided to form an integrated circuit, a large number of passive circuit elements and active circuit elements can be included in a single semiconductor device structure. In one example, the semiconductor device structure is to go into a current sensor chip product.

At S120, the wafer is worked and a layer or layers including, for example, a layer with metal structures and/or a dielectric layer are formed to provide the plurality of semiconductor device structures. At least one effect can be to form, with each semiconductor device structure, an essentially same product, for example, an integrated circuit die of the same type. The method can further comprise, depending on the products to be manufactured with the wafer, for some or for each semiconductor device structure on the wafer, preparing the wafer for selectively receiving a conductive substance to form a configured circuit element on the wafer. As will be shown and discussed below, the semiconductor device structures are thus made to include structures of configurable elements that lend themselves to configuration or alteration according to the techniques disclosed herein. For example, a single configurable circuit element can be used in configuring digital and/or analog configurable elements such as tuning elements or to alter the digital and/or analog configurable elements.

In some embodiments, each semiconductor device structure comprises a first portion configured to provide a digital configurable element that is to form part of the integrated circuit. In some embodiments, each semiconductor device structure comprises a second portion configured to provide an analog configurable element that also is to form part of the integrated circuit. In some embodiments, the semiconductor device structure comprises both, the first portion and the second portion. While herein, for the sake of simplicity, reference is only made to one digital configurable element and one analog configurable element per semiconductor device structure, it should be understood, that more configurable elements can be envisaged per semiconductor device structure. It should be understood that the configurable element being provided as a tuning element merely serves as an example. In another example, a particular portion of the semiconductor device structure could be configured to perform certain signal processing or other function and could include the switching element to be formed in accordance with the present disclosure as set forth below with reference to configuring the tuning element. For example, in some embodiments, where the semiconductor device structure is to form an integrated circuit, the integrated circuit comprises a first circuit portion and a plurality of second circuit portions, wherein the configurable circuit element can be configurable to electrically connect the first circuit portion to a selected one or selected ones of the plurality of second circuit portions.

It should be understood that the act of providing the wafer for front-end processing, at S110, can comprise conventional front-end processing steps to form the plurality of semiconductor device structures. While the act of providing the wafer, at S110, and the act of working the wafer, at S120, to form the first portion and the second portion, are separately discussed as if to be performed one after the other, the sequence can be reversed and one act can form part of the other act. In particular, the act of forming the first circuit portion and/or the second circuit portion can precede or be included in the act of providing the wafer. For example, where the semiconductor device structure is to go into the current sensor chip product, the current sensor can be designed to include a meandering conductor structure that forms a resistance. The resistance can be made of a substance that has a lower conductivity than other conductor line material. The resistance can be embedded in different layers of the semiconductor device structure. In some implementations, the resistance can be designed as a tuning element configurable to compensate variations of a shunt resistance due to variations in front-end processing to the extent completed when configuring the configurable element.

At S130, the method comprises testing semiconductor device structures formed on the wafer. It should be understood that, while the testing can be limited to one semiconductor device structure or to a selection of the semiconductor device structures, for example to selected ones of integrated circuits, in some embodiments, testing will be performed on each of the semiconductor device structures formed on the wafer. Further, it should be understood that the testing can be limited to a selected functionality and/or portion of the semiconductor device structure. For example, where the semiconductor device structure is to go into the current sensor chip product, the testing can include measurement of the shunt resistance.

At S140, test results are processed, for example, using a test device data processor. For example, where semiconductor device structures are to go into current sensor chip products, the processing can include a comparison of the measured shunt resistance values to a target resistance value. The data processing can be performed to calculate a desired tuning resistance value that depends on the difference between the target resistance value and the measured shunt resistance value in the tested device. For example, the data processing can be performed to identify one or more locations where the meandering conductor structure should be bridged by a conductive bridge that effectively short-circuits the bridged meander or open loop of the meandering structure. It should be understood that, from one semiconductor device structure to another, on the same wafer, different shunt resistance values can be measured and, accordingly, different locations to bridge the meandering conductor structure can result. In another example, data represent information that is individually associated with one semiconductor device such as the very semiconductor device that is to include the semiconductor device structure under test. For example, a digital representation of the measured value can be determined. In some embodiments, the information is based on the test result. In some embodiments, the locations for selectively providing the substance on the selected portion of the wafer encode the information associated with the tested semiconductor device structure. At least one effect can be that, when further processing the wafer, digital printing methods can be used, which allow an application of flexible and/or individual print files and/or structures that can be generated for each chip individually, based on the measurement data.

At S150, based on a test result, a substance, for example held in a reservoir or channel of a dispenser tool, is provided on a selected portion of the wafer to selectively configure the configurable element of the respective semiconductor device structure. In some implementations, a smallest extension of a diameter or cross section of the area covered by the substance at the selected portion of the wafer is about one hundred micrometer or less than one hundred micrometer, for example, about ten to twenty micrometer, wherein, for example, the semiconductor device is a power transistor. In some implementations, a smallest extension of a diameter or cross section of the area covered by the substance at the selected portion of the wafer is about one micrometer to ten micrometer, wherein, for example, the semiconductor device is a power transistor device and the substance is for use in connecting a sensor element to the power transistor. In some implementations, a smallest extension of a diameter or cross section of the area covered by the substance at the selected portion of the wafer is about one micrometer or less than one micrometer. For example, in one implementation an approximately rectangular area of about 2 µm×130 nm is covered; in another example, an approximately circular area having a diameter of approximately 1 µm, 500 nm, 250 nm or 130 nm is covered. To give one example of a digital configurable element, the digital configurable element can thus be configured to represent the measured value in accordance with the digital representation of the measured value that was determined when processing the test result. In some embodiments, the substance, at the time of providing the substance, is at least one selected from the group consisting of a liquid, a suspension in a liquid, a paste. In some embodiments, the substance comprises a metal. For example, the liquid can be a metal heated above the metal's melting temperature. In another example, the liquid can be a conductive resin, for example, a resin mixed with a powder of conductive particles so as to provide a conductive liquid. In still another embodiment, the substance is a conductive paste. Materials to be deposited can encompass, but are not limited to, metal inks, such as nano-particle containing inks, or chemical metal precursor inks that lead to electrically conducting layers and/or structure. Depending on a desired resistivity of the added structure, pure metals can be applied selected, for example, from a group consisting of Cu, Ag, Au, Ni, Sn and In, or systems can be applied that lead to specific alloys, e.g., mixtures of the afore-mentioned metals. Other electrically conducting materials can also be used, either alone or in addition, such as metal oxides, conducting organic polymers or mixtures of them with metal particle.

The act of printing the conductive substance can include heating the liquid, for example while keeping the liquid in a reservoir prior to dispensing the liquid, so as to keep the liquid fluid. In some embodiments, the method comprises ejecting the substance from the reservoir. In some embodiments, the method comprises providing the liquid in a cavity, sponge or other reservoir coupled to a dispenser. The dispenser, for example, can be provided as a nozzle. The act of ejecting the substance from the reservoir can include increasing a pressure inside the cavity by moving a cavity wall to reduce a cavity volume and/or by heating the liquid inside the cavity, and ejecting the liquid through the dispenser. In some embodiments, the liquid is dispensed in accordance with control signals provided to an actuator that can deform the reservoir. The control signals can be provided so as to direct dispensed substance to the selected portion(s) on the wafer, while keeping other portions free from the dispensed substance. In some embodiments, the method comprises electrically charging the substance ejected from the reservoir and controlling an electric field to direct the substance. Accordingly, some embodiments comprise, after measuring the device, selectively introducing printed structures on the semiconductor device structure. At least one effect can be that chip-individual structures can be formed to achieve results optimized individually for selected chips. Available printing technologies encompass, but are not limited to, inkjet printing as well as digitally controllable methods of nozzle spraying or electro spraying.

Where the substance is a paste, the dispenser can be provided, for example, as an extruder.

At S160, the wafer is treated to fixate the conductive substance. In some embodiments, the substance effectively configures the circuit element as a conductor element. In some embodiments, the method further comprises hardening the substance. Thus, a post-print treatment step can be applied in order to convert the deposited material into a final desired form of a conducting structure. This can be a drying step to remove solvent and/or a sintering step. Energy can be provided in various ways: Baking the wafer, for example in an oven and/or exposing the wafer surface to radiation can be used. For example, where the liquid is resin, the wafer can be exposed to radiation of a predetermined spectrum such as infrared radiation or ultraviolet radiation as required to cure the particular resin used in the process. In some implementations, high energy Xe-flash lamps or laser radiation is used. In one example, where the liquid is a metal, the wafer is cooled below the melting point of the matter. In some embodiments, the act of hardening the substance comprises curing the substance. One effect can be that the substance becomes solid. In yet another example, where the substance is a paste, the wafer may be heated in order to bake the paste. It should be understood that the act of hardening the substance to become solid can include evaporation of a part of the substance such as, for example, evaporation of a solvent comprised in the substance. The print can be applied as a short-connection in a meander structure, for example, on an unstructured support surface or the print can be provided on predetermined locations, which have a guiding structures such as cavities and/or trenches suitable to be filled with ink.

At S170, the method can further comprise selectively providing a dielectric at least on the selected portion(s) of the wafer that received the conductive substance. At least one effect can be that the dielectric passivates the freshly formed tuning element. In some implementations, further process printing steps can be performed in order to selectively provide a deposition of passivating substance.

At S180, in some implementations, completion of front-end processing of the wafer is thus determined.

At S190, the wafer can be subjected to back-end processing, for example, dicing can be performed to separate semiconductor dice from the wafer that include the configurable element(s) being individually configured as described above.

In an aspect, the invention encompasses a method for use in manufacturing semiconductor devices that, as described above, comprises testing the wafer. The wafer can have a plurality of semiconductor device structures in at least a first structural layer on the wafer. The method further comprises adding another structural layer on the wafer, whereby further circuit elements are completed and/or added. In some implementations, the act of adding another structural layer includes a lithographic process. The method comprises, between the acts of testing the wafer and adding another structural layer on the wafer, selectively depositing a substance at a selected location on a selected portion of the wafer comprising one semiconductor device structure. The method can comprise selectively providing the substance on the wafer to obtain an altered wafer. The altered wafer has, based on the test result, at least one selected portion altered.

Accordingly, in some implementations, at S180, if it is determined that further front-end processing is needed to complete the semiconductor device structures on the wafer, the wafer can, once again, be subjected to the above-described processes, whereby at least one more structural layer is provided on the wafer.

In sum, in some implementations, there is provided a method comprising testing a semiconductor device structure destined to go into a chip, based on results of this test selecting a pattern of connections to be printed on the chip, and printing the connection pattern itself. After the printing step a post-treatment step can be applied, depending on the nature of the printed material with the aim of transforming the deposited material into an electrically conducting material. At least one effect can be a selective making of one or more circuit connections, wherein the selection depends on device-individual properties determined in the testing of the semiconductor device structure.

One example of an embodiment can be: Forming an interrupted conductive line on a semiconductor device structure for use in a chip, opening a window surrounding this interruption in the insulating layer covering this line, and, at least partially, filling this window with a conductive ink using a printing technique such that the interrupted halves are electrically connected.

Figure 2A:
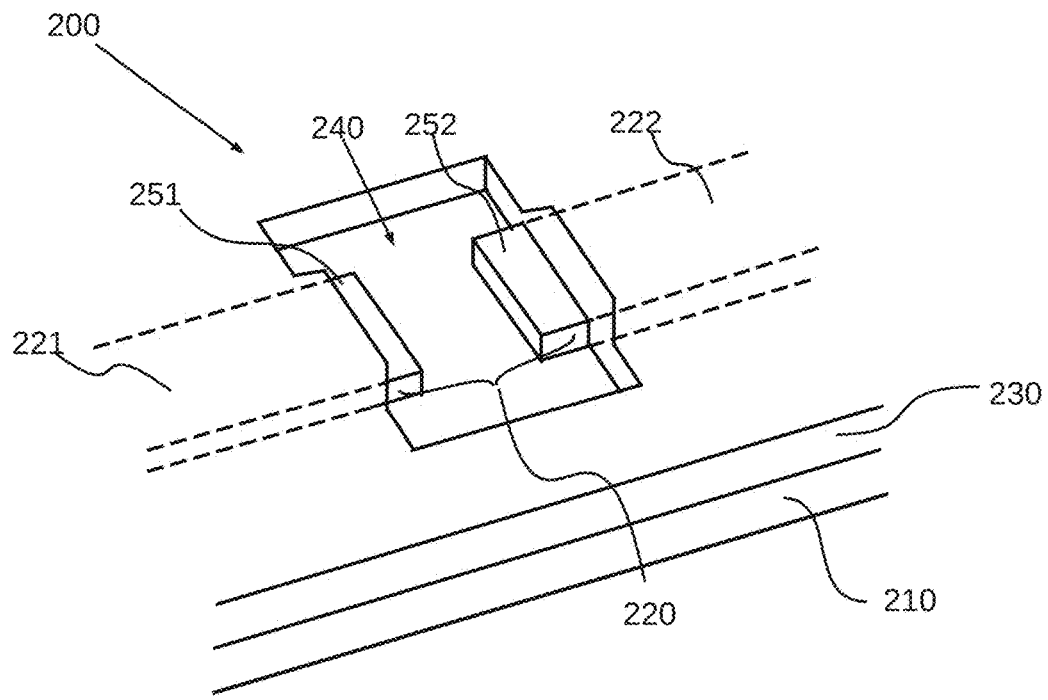
FIG. 2A and FIG. 2B illustrate a perspective view of a configurable circuit element structure according to some embodiments.
Figure 2B:
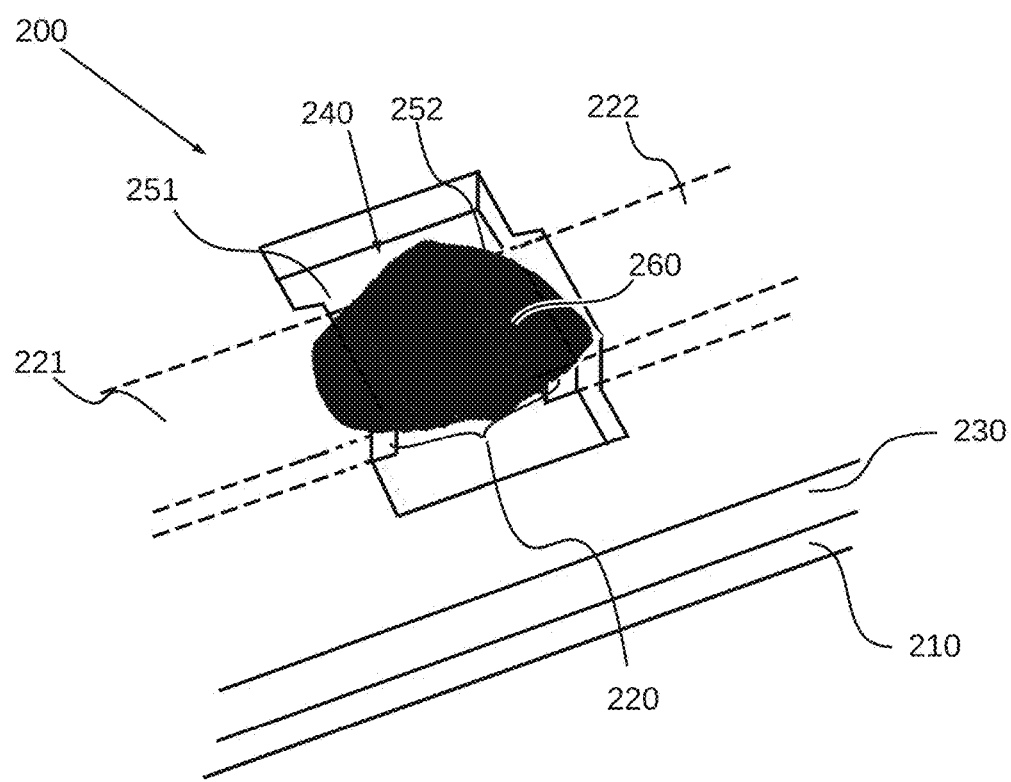

In some embodiments, the act of working the wafer, at S120, comprises forming a cavity suitable to receive the substance. One example of an embodiment is: Forming a conductive line in a conductive layer such as a metal layer, wherein the conductive line is formed with an interruption. The embodiment can further comprise providing an insulating layer above the conductive layer and opening a window in the insulating layer that covers the conductive line, wherein the window is provided so as to expose the interruption. FIG. 2A illustrates a perspective view of a configurable circuit element structure 200 according to some embodiments. The configurable circuit element structure 200 can, for example, result from performing processing steps as described above. On a substrate 210, a first metal line 221 and a second metal line 222 are provided. The first metal line 221 and the second metal line 222 are coaxially aligned such that a terminal end 251 of the first metal line 221 faces a terminal end 252 of the second metal line 222 spaced apart from one another by a gap. In some embodiments, the gap is approximately as wide as the width of the first metal line 221 and/or the width of the second metal line 222. Thus, the ensemble of the first metal line 221, the gap and the second metal line 222 forms an interrupted conductor line 220. Atop the interrupted conductor line 220, in the example, an insulating layer 230 can be deposited. In the insulating layer 230, a window 240 is opened above the interrupted conductor line 220 such that the terminal end 251 of the first metal line 221 and the terminal end 252 of the second metal line 222 are exposed within the window 240 to form a pair of conductive landings. FIG. 2B illustrates a perspective view of the configurable circuit element structure 200 discussed above with reference to FIG. 2A. In the window 240, at the interruption of the interrupted conductor line 220, a blob of conductive substance 260, essentially centered in the gap between the terminal ends 251, 252, extends to cover at least a portion of both terminal ends 251 and 252 and, thus, bridges the interruption caused by the gap between the terminal ends 251, 252 to electrically connect the first metal line 221 and the second metal line 222 to one another.

In one aspect, the invention encompasses a die. The die comprises an array of dielectric landings electrically separating two conductive nodes associated with the respective dielectric landing. Further, the die can comprise one or more conductive blob, for example droplet or line, each located on another of the dielectric landings to establish an electrical connection between the two conductive nodes associated with the dielectric landing, wherein a surface of the conductive blob, such as droplet or line, has a convex cross-section. In some embodiments, the configurable circuit element at the selected location within the first semiconductor device structure elevates convexly above a plane atop the landing provided with the first semiconductor device structure. It should be understood that, even though reference is made to circuit element as 'configurable', once the conductive connection is fixed to electrically bridge the gap between the two conductive nodes, the configurable circuit element is, in fact, configured.

Figure 3A:
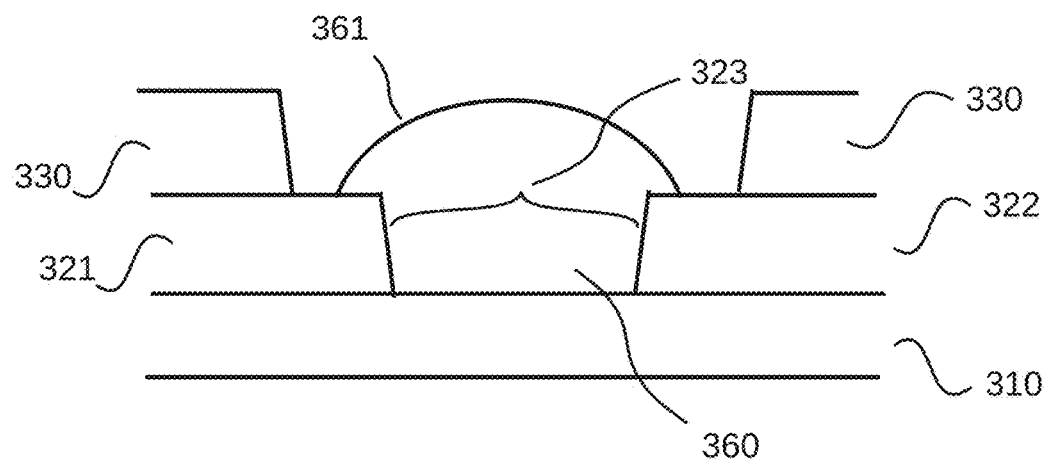
FIG. 3A and FIG. 3B illustrate cross-sectional views of a configurable circuit element structure according to some embodiments.
Figure 3B:
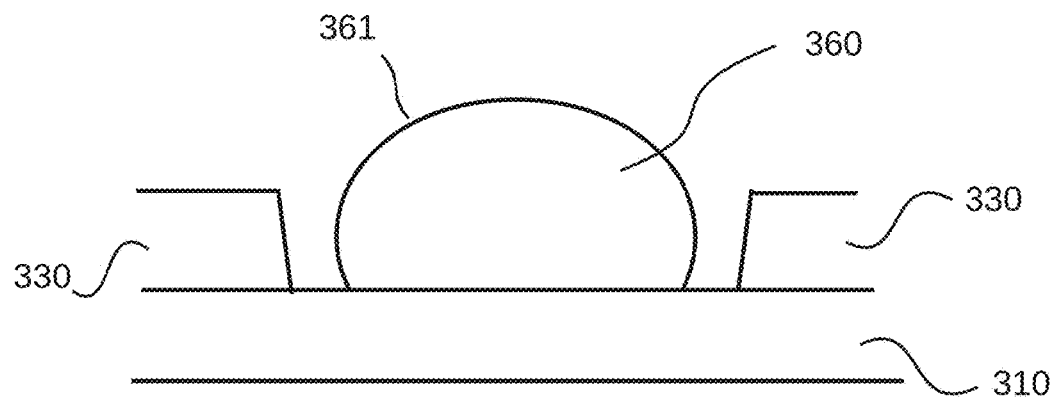

FIG. 3A and FIG. 3B illustrate a cross-sectional view of a configurable circuit element structure according to some embodiments, essentially as depicted in FIG. 2B. FIG. 3A illustrates a view along a longitudinal axis of a first metal line 321 and a second metal line 322 that are provided on a substrate 310 and spaced apart by a gap 323 to form an interrupted conductor line. A dielectric layer 330 is formed above the metal. However, the dielectric layer 330 is removed to form a window, wherein a terminal end portion of the first metal line 321 and a terminal end portion of the second metal line 322 are not covered by the dielectric layer 330. In this example, a blob of conductive substance 360 is applied, inside the window, on the substrate 310, filling the gap 323 and covering also an edge portion of the first metal line 321 and an edge portion of the second metal line 322 to establish a conducting line. Due to surface tension, the blob of conductive substance 360 has a convex surface 361. The convex surface 361 of the blob 360 is better appreciated when looking at FIG. 3B that illustrates a cross-sectional view in a plane orthogonal to the longitudinal axis in a portion of the gap 323. In this cross-sectional view, first metal line 321 and a second metal line 322 are not seen. The walls of the dielectric layer 330 can be seen to form the window on the substrate 310.

Figure 4:
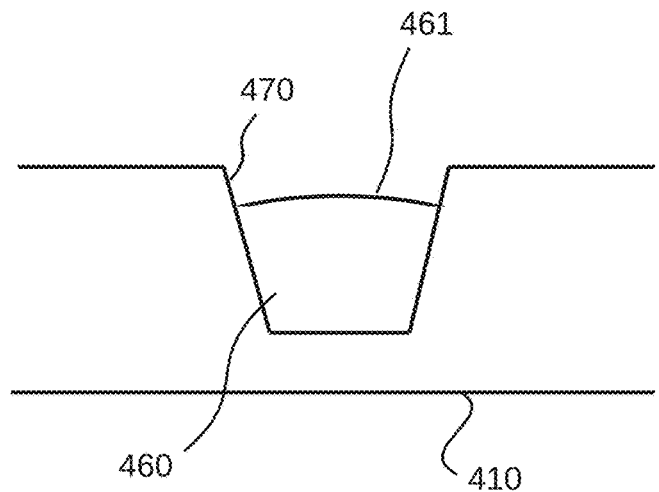
FIG. 4 illustrates a cross-sectional view of a configurable circuit element structure according to some embodiments.

FIG. 4 illustrates a cross-sectional view of a configurable circuit element structure according to some embodiments similar to the example shown in FIGS. 3A and 3B. In this example, a blob of conductive substance 460 is supplied in a trough 470 that is formed in a substrate 410. The surface tension of the conductive substance 460 provides for the blob to have a convex surface 461. For example, the trough 470 can have the size of a via that connects conductor lines (not shown) formed in two different metal layers.

Figure 5:
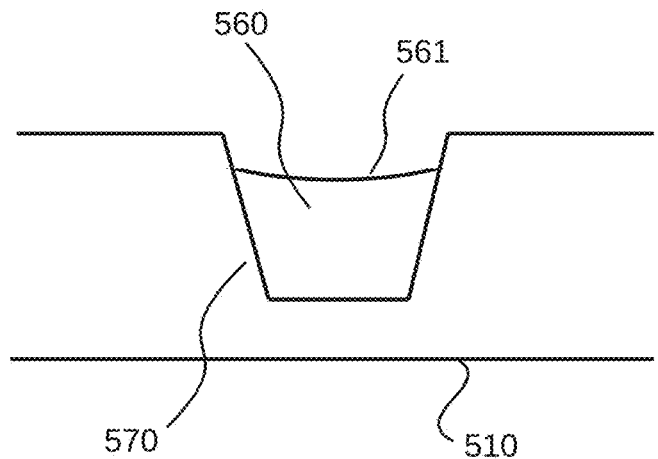
FIG. 5 illustrates a cross-sectional view of a configurable circuit element structure according to some embodiments.

FIG. 5 illustrates a cross-sectional view of a configurable circuit element structure according to some embodiments. In this example, a blob of conductive substance 560 is supplied in a trough 570 that is formed in a substrate 510. The surface tension of the conductive substance 560 is smaller than the capillary force that makes the conductive substance 560 "climb up" the wall of the trough 570. Thus, the conductive substance 560 has a concave surface 561.

Figure 6:
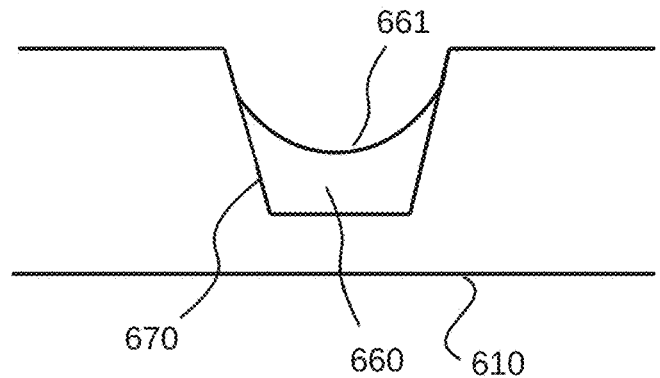
FIG. 6 illustrates a cross-sectional view of a configurable circuit element structure according to some embodiments.

FIG. 6 illustrates a cross-sectional view of a configurable circuit element structure according to some embodiments. In this example, a blob of conductive substance 660 was provided, as shown in the examples of FIG. 4 and FIG. 5 in a trough 670 that is formed in a substrate 610. Then, part of the substance forming the blob went away, for example a solvent used as a carrier of the conductive substance 660 evaporated, leaving the rest of the blob with a reduced volume. While the conductive substance sticks to the walls of the trough 670, a central portion of the blob sank to form a concave surface 661.

In one aspect, the invention encompasses a mask for use in wafer lithography. The mask comprises a pattern configured to project a metal structure onto the wafer. In some embodiments the pattern comprises a plurality of identical pattern portions. Each of the identical pattern portions comprises an array of pairwise opposed conductor terminal ends, wherein the terminal ends each comprise a round tongue tip. The mask can be used in the method for manufacturing semiconductor devices as discussed above, for example, with reference to FIG. 1.

Figure 7:
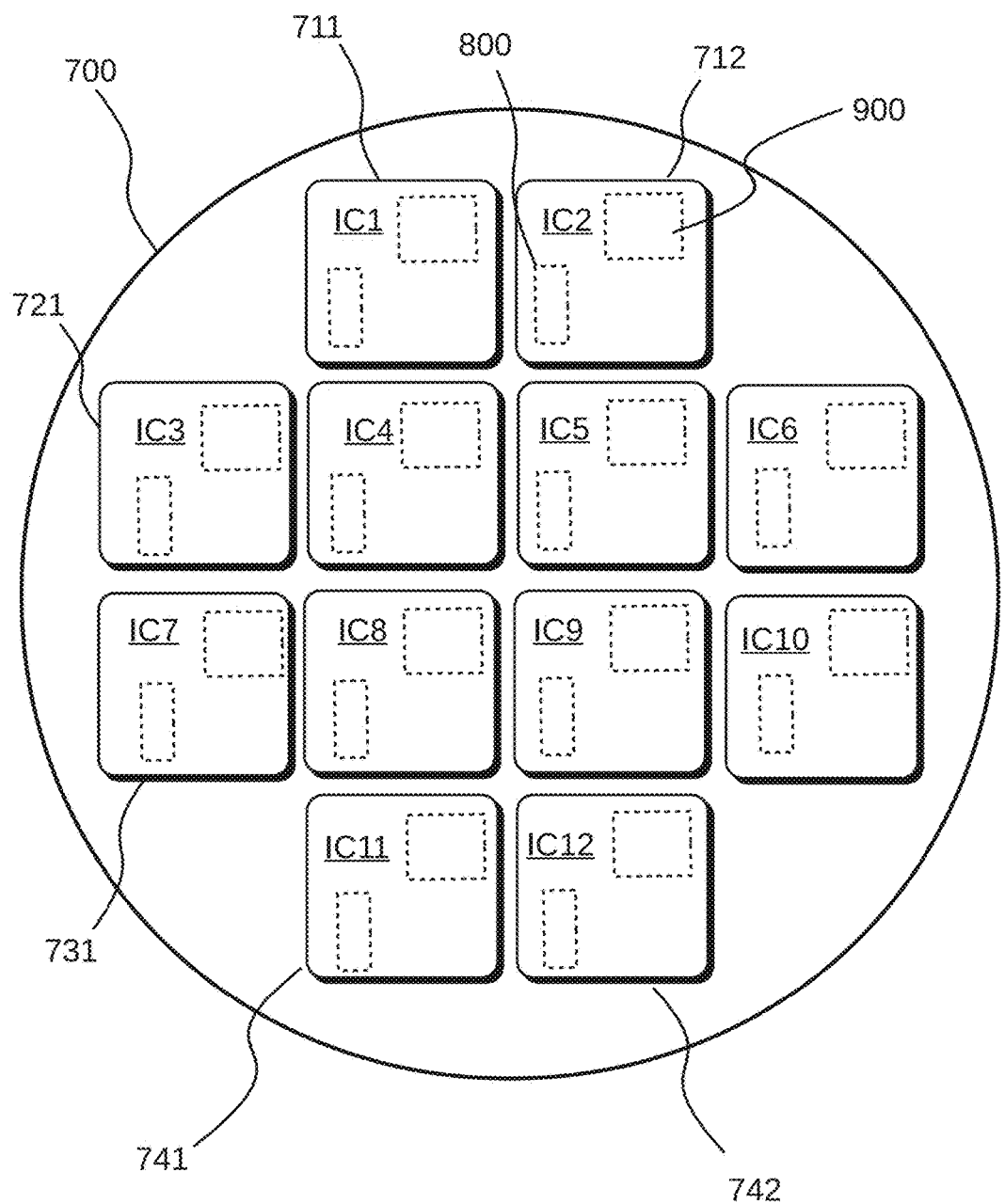
FIG. 7 illustrates a schematic top view of a wafer comprising a plurality of semiconductor device structures according to some embodiments.

FIG. 7 illustrates a schematic top view of a wafer 700 comprising a plurality of semiconductor device structures 711, 712, 721, ..., 731, ..., 741, 742 according to some embodiments. It should be understood that, while in FIG. 7 twelve semiconductor device structures are shown, this number is merely for illustrative purposes, and the wafer can comprise any other number of semiconductor device structures that fit on the wafer depending at least on an area of the wafer available for dice to be manufactured and on an area of each of the dice to be manufactured from the wafer. The semiconductor device structures 711 . . . 742, in some embodiments, are configured to each form part of a separate die that, in turn, will go into a separate semiconductor device. In some embodiments, resultant semiconductor device chips are destined to be of the same type. In these embodiments, the semiconductor device structures 711 . . . 742 are identical so long as they have not been configured according to the methods disclosed herein. In other embodiments (not shown), the semiconductor device dice can be destined to be of different types. In the example shown in FIG. 7, the semiconductor devices are provided as integrated circuits, but it should be understood that the embodiments disclosed herein can also be implemented in manufacturing other semiconductor devices than integrated circuits. In these embodiments, the integrated circuit structures can vary between one another. The integrated circuit structures 711 . . . 742 each comprise at least one of the circuit element structure portions configured in accordance with the teaching of the present disclosure that will be described below with reference to FIGS. 8A and 8B, FIGS. 9A and 9B, FIGS. 13A and 13B and FIGS. 14A and 14B.

In another aspect, the invention encompasses a wafer comprising a plurality of like semiconductor device structures each having a plurality of circuit elements, wherein a passive circuit element provided at a selected location between a first pair of conductor terminal ends within a first semiconductor device structure differs from another passive circuit element provided at the selected location between a second pair of conductor terminal ends within a second semiconductor device structure in that the passive circuit element within the first semiconductor device structure comprises a conductive substance, while the another passive circuit element does not comprise any conductive substance. At least one effect can be that the passive circuit element is more electrically conductive than the another passive circuit element. In other words, the another passive circuit element is more resistive than the passive circuit element.

In another aspect, the invention encompasses a die. The die comprises a plurality of dielectric landings, wherein each dielectric landing electrically separates two conductive nodes associated with the dielectric landing. Further, the die comprises a conductive substance digitally distributed across the plurality of dielectric landings. Where present on a dielectric landing and in contact with both of the conductive nodes associated with the dielectric landing, the conductive substance can establish an electrical connection between the two conductive nodes. In some embodiments, the plurality of dielectric landings is arranged in an array. In some embodiments, the distribution of electrical connections across the dielectric landings represents a bit sequence.

In some embodiments, for each dielectric landing, one node of the two conductive nodes is coupled to a same common node for all of the plurality of dielectric landings, while the other node of the two conductive nodes is coupled, for example, to a sensor element associated with the dielectric landing.

Figure 8A:
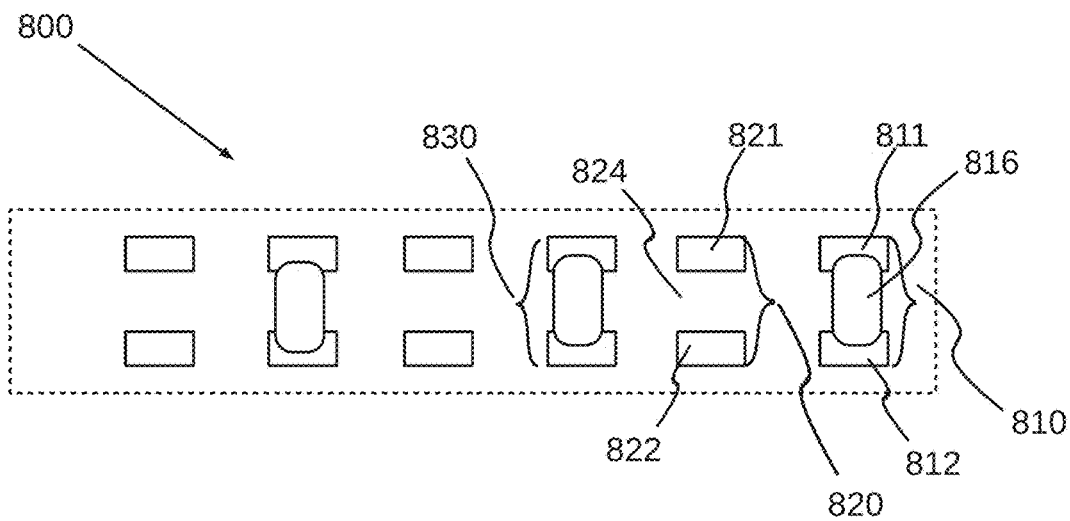
FIG. 8A illustrates a top view of an exemplary first configurable circuit element structure according to some embodiments.

FIG. 8A illustrates a top view of an exemplary first configurable circuit element structure comprised in an exemplary first semiconductor device structure, that is, in the example, the integrated circuit structure 711 of the wafer 700 in FIG. 7. The first configurable circuit element structure is provided as an array 800 of ensembles 810, 820, 830, ..., each including, as described above with reference to FIGS. 2A and 2B, a pair of conductor terminal ends spaced apart by a gap to be digitally configurable. The conductor terminal ends are opposed to one another so as to form an interrupted conductor line. With the wafer having been worked according to the method described herein, some of the pairs of conductor terminal ends are electrically connected by a conductive substance, whereby the first configurable circuit element is, in fact, configured. For example, conductor terminal ends 811, 812 of a first pair 810 are electrically connected by a blob 816 of conductive substance whereas a second pair of conductor terminal ends 820 is interrupted in a space 824 between a first terminal end 821 and a second terminal end 822. It should be understood, that a pattern of connected and interrupted pairs of landings in the array 800 can differ from one semiconductor device structure to another on the same wafer 700.

Figure 8B:
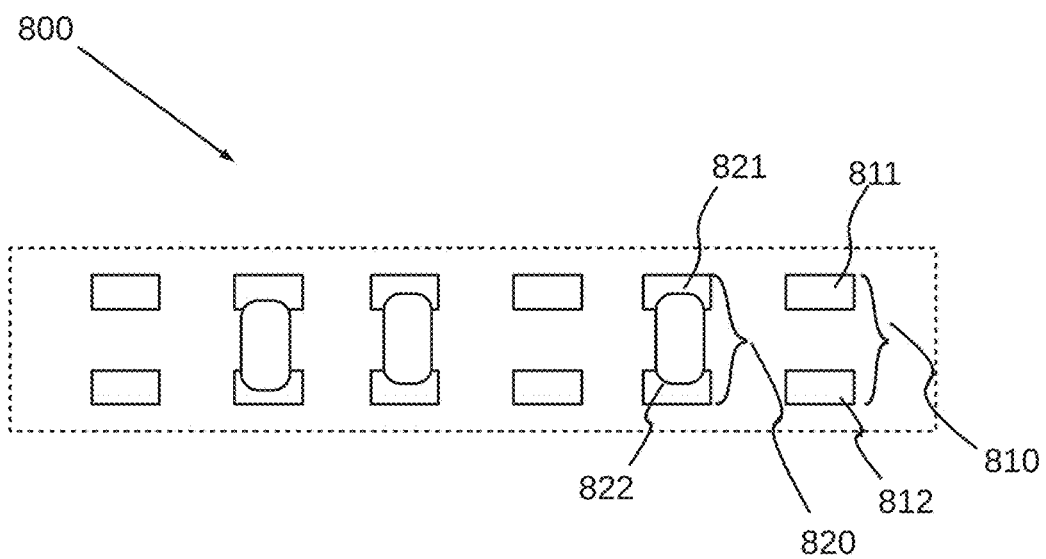
FIG. 8B illustrates a top view of another example of the first configurable circuit element structure according to some embodiments.

FIG. 8B illustrates a top view of another example of the first configurable circuit element structure comprised in an exemplary second integrated circuit structure 712 of the wafer in FIG. 7. For example, while the first configurable circuit element structure that forms part of the first integrated circuit structure 711, is shown in FIG. 8A to have a pattern of '010101' (wherein '0' represents 'interrupted' and '1' represents 'connected' or 'bridged'), the first configurable circuit element structure that forms part of the second integrated circuit structure 712, as shown in FIG. 8B, has a different pattern (in this example '011010'). In accordance with the present disclosure, for example as discussed with reference to the method illustrated in FIG. 1, a test can have been performed on the first integrated circuit structure 711, and the pattern '010101' of the first configurable circuit element structure that forms part of the first integrated circuit structure 711 can be based on a result of that test. Since the test, when performed on the second integrated circuit structure 712, could have provided a different result, also the pattern to be formed with the array of landings of the first configurable circuit element structure that forms part of the second integrated circuit structure 712 in order to configure the same (as shown in FIG. 8B) can be different from the pattern provided with the first integrated circuit structure 711.

Figure 9A:
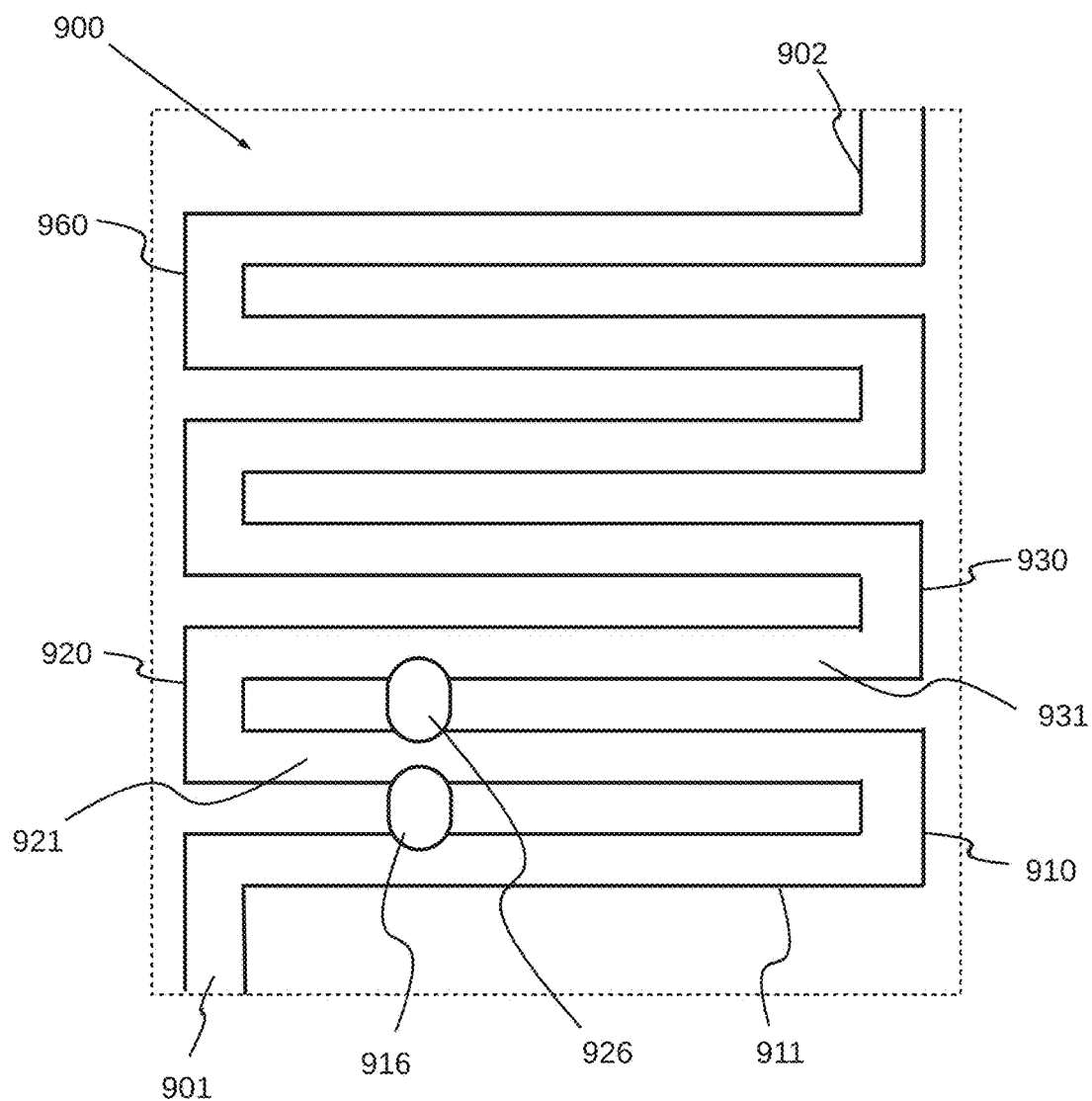
FIG. 9A illustrates a top view of an exemplary second configurable circuit element structure according to some embodiments.

FIG. 9A illustrates a top view of an exemplary second configurable circuit element structure comprised in the first integrated circuit structure 711 of the wafer in FIG. 7. The second circuit element structure comprises an arrangement 900 of a conductor line that runs from a first node 901 to a second node 902 and meanders in between the first node 901 and the second node 902 to be analogically configurable. The conductor line forms meandering loops 910, 920, ..., 960. Between branches 911 and 921 of the loop 910, a first blob of conductive substance 916 is provided in accordance with the method described above, that short-circuits the branches 911 and 921, whereby the second configurable circuit element is, in fact, configured. Likewise, between the branches 921 and 931 of the loop 920, a second blob of conductive substance 926 is provided that short-circuits the branches 921 and 931. At least one effect can be that a resistance of the meandering conductor line is reduced because of short-circuits that reduce the length of the current path between the first node 901 and the second node 902. One effect can be that an inductance and/or a capacitance of the conductor line is altered. In accordance with the present disclosure as described above, for example with reference to the method illustrated in FIG. 1, a test can have been performed on the first integrated circuit structure 711, and the presence and position of the first blob of conductive substance 916 and of the second blob of conductive substance 926 can be based on a result of that test. Since the test, when performed on the second integrated circuit structure 712, could have provided a different result, also the presence and position of blobs of conductive substance provided to effectively shorten the meandering conductor line could be different from the presence and position provided with the first integrated circuit structure 711.

Figure 9B:
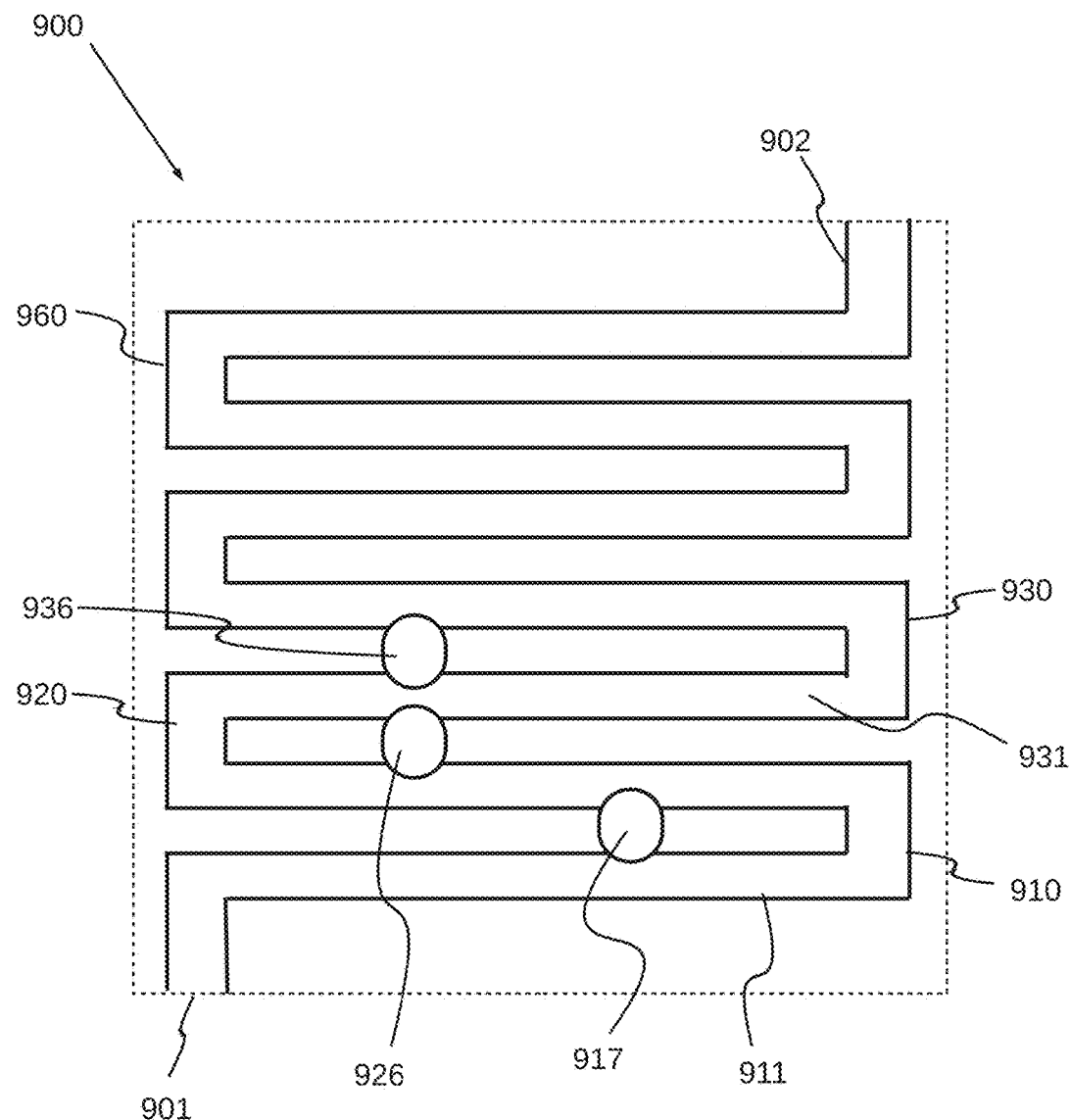
FIG. 9B illustrates a top view of another example of the second configurable circuit element structure according to some embodiments.

FIG. 9B illustrates a top view of another example of the second configurable circuit element structure comprised in the second integrated circuit structure 712 of the wafer in FIG. 7, wherein the arrangement 900 of the conductor line is the same as in FIG. 9A. However, the configuration of the second configurable circuit element structure differs: While the second configurable circuit element structure 900 that forms part of the first integrated circuit structure 711, is shown in FIG. 9A to have two blobs 916 and 926 set to provide two short-circuits on the meandering conductor line, the second configurable circuit element structure that forms part of the second integrated circuit structure 712, as shown in FIG. 9B, has three blobs 916, 926 and 936 set to provide three short-circuits on the meandering conductor line. In accordance with the present disclosure, a test can have been performed on the first integrated circuit structure 711, and the distribution pattern of blobs 916 and 926 of the second configurable circuit element structure that forms part of the first integrated circuit structure 711 can be based on a result of that test. Since the test, when performed on the second integrated circuit structure 712, can have provided a different result, also the distribution pattern of blobs to be formed on the meandering conductor line of the second configurable circuit element structure that forms part of the second integrated circuit structure 712 in order to configure the same (as shown in FIG. 9B) can be different from the pattern provided with the first integrated circuit structure 711.

Figure 10:
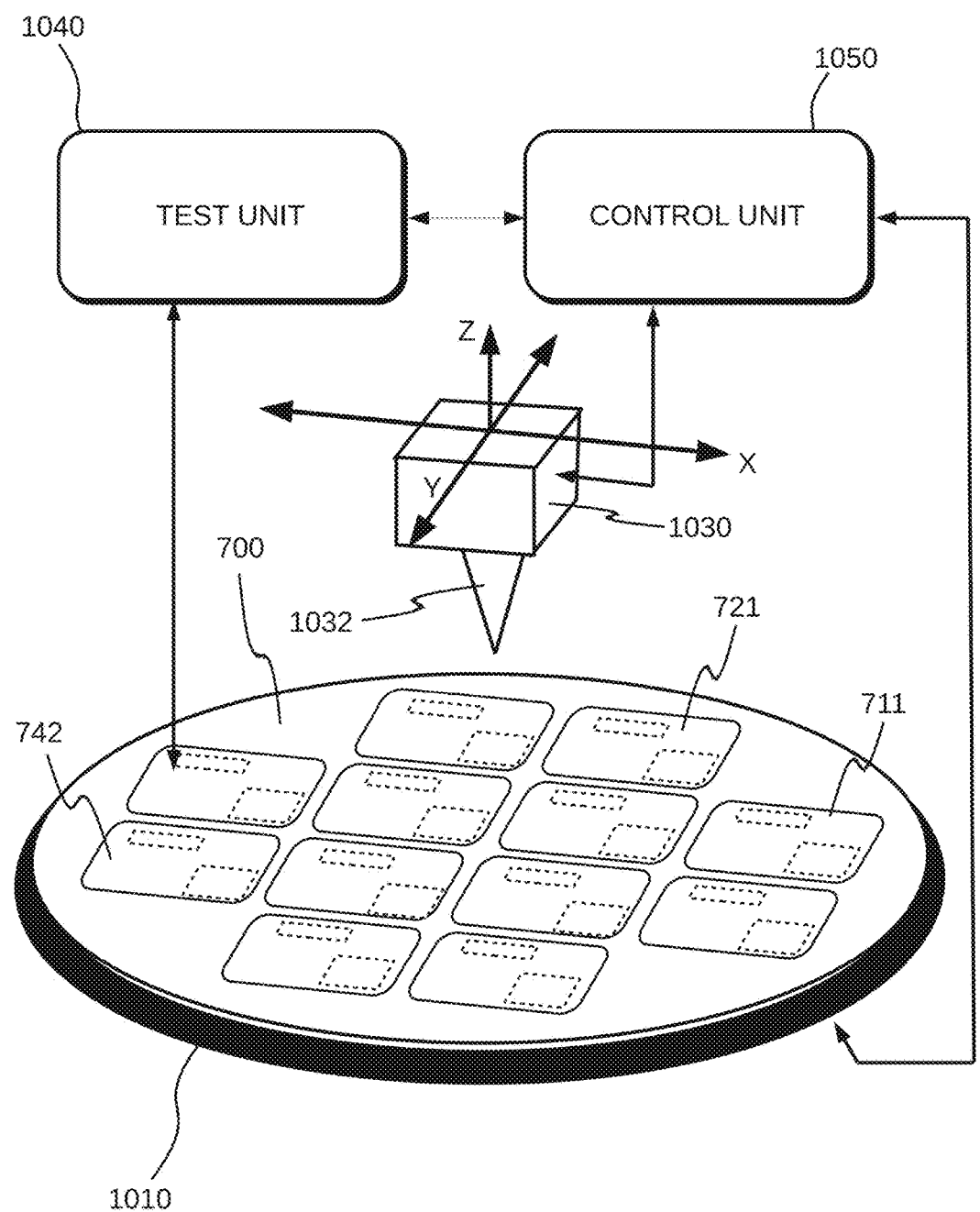
FIG. 10 illustrates a schematic view of an apparatus for use in manufacturing semiconductor devices according to some embodiments.

FIG. 10 illustrates a schematic view of an apparatus for use in manufacturing semiconductor devices according to some embodiments in one aspect encompassed by the invention. In some embodiments the apparatus comprises a chuck 1010 configured to support a wafer 700. As described above, the wafer may comprise a plurality of semiconductor device structures 711, 721, . . . , 742.

In some embodiments, the apparatus comprises a printing unit 1030 that is configured to print a substance onto the wafer 700. In some embodiments the printing unit 1030 comprises a cavity or other reservoir to receive a substance for printing. The cavity can be configured to raise a pressure inside the cavity. For example, the cavity can be configured to reduce a cavity volume and/or to heat the substance inside the cavity. In some embodiments the printing unit 1030 comprises a delivery device 1032 such as a nozzle configured to eject a liquid or an extruder configured to release a paste from an opening. In some embodiments, the substance can be conductive. The substance can be liquid or be comprised in a liquid, or the substance can be a paste or be comprised in a paste. For example, the printing unit can be provided as an inkjet printer. Accordingly, in some embodiments, the substance is provided in an ink.

In some embodiments, the apparatus comprises a test unit 1040 that is configured to perform tests on wafer 700. In some embodiments, the test unit 1040 is configured to generate wafer test data.

Further, the apparatus can comprise a control unit 1050. In some embodiments, the control unit 1050 is communicatively coupled to the chuck 1010, to the printing unit 1030 and/or to the test unit 1040. The control unit 1050 can be configured to process wafer test data. The control unit can be configured to provide control signals to the printing unit 1030 and/or to the test unit 1040, wherein, in some examples, the control signals can be based on the wafer test data. In some embodiments the control unit 1050 is configured to control a driver (not shown) and/or other functional units comprised within test unit 1040 so as to perform tests on wafer 700 and generate test data and to collect measurement data representative of measurement signals that are detected by test unit 1040. In some embodiments, the control unit 1050 is configured to control a driver (not shown) of chuck 1010 so as to move wafer 700 on the chuck 1010 relative to the printing unit 1030. In some embodiments, the chuck 1010 can be driven to rotate, for example, about the chuck's axis of rotational symmetry or other central axis. In some embodiments, the control unit 1050 is configured to control a driver (not shown) of the printing unit 1030 so as to move the delivery device 1032 relative to chuck 1010, for example, along at least one of the axes X, Y of translational motion and/or along the axis Z of vertical motion with respect to chuck 1010. At least one effect can be that the control unit 1050 can control the printing unit 1030 and/or the chuck 1010 so as to deliver the substance from the delivery device 1032 at selected portions on the wafer 700.

In a variant, the apparatus for use in manufacturing semiconductor devices is configured to deliver an etching substance. The apparatus comprises a printing unit that is configured to print an etching substance on selected portions of a wafer. In some embodiments, the printing unit is provided as an inkjet printer and the etching substance is provided in an ink. As described above with reference to FIG. 10, the apparatus can further comprise a test unit configured to generate wafer test data, and a control unit configured to process the wafer test data and to provide, based on the wafer test data, control signals to the printing unit.

In one aspect, the invention encompasses a method for use in manufacturing semiconductor device chips. The method comprises providing a wafer having a plurality of semiconductor device structures. In some embodiments, the method comprises configuring selected portions of the wafer to receive a liquid. In some embodiments, the act of configuring the wafer comprises forming the wafer surface with a recess to receive the liquid. In some embodiments, the act of selectively providing the liquid on the selected portion of the wafer encodes information associated with the tested semiconductor device onto the wafer. The method comprises testing a semiconductor device structure. In some embodiments, the information is based on the test result. In some embodiments, the act of configuring the wafer for receiving the liquid is performed prior to an act of testing the at least one semiconductor device structure. The method comprises, based on a test result, selectively altering a circuit element of the semiconductor device structure by providing the liquid on the selected portions of the wafer. In some embodiments, the liquid comprises an etchant. In some embodiments, the method comprises etching the at least one circuit element. In some embodiments, the circuit element is a conductor element. Some embodiments of the method comprise selectively providing a dielectric on the selected portion of the wafer that passivates the at least one altered circuit element.

Some embodiments of the method comprise ejecting the liquid from a reservoir, electrically charging the liquid, and controlling an electric field to direct the liquid. Some embodiments of the method comprise providing the liquid in a cavity having a nozzle. The method can comprise increasing a pressure inside the cavity. In some embodiments the act of increasing the pressure comprises reducing a cavity volume and/or heating the liquid inside the cavity. The method can comprise ejecting liquid through the nozzle.

In some embodiments, each semiconductor device comprises an integrated circuit having a first circuit portion and a plurality of second circuit portions. In some embodiments, the altered circuit element keeps the first circuit portion from electrically connecting to a selected one of the plurality of second circuit portions.

Figure 11:
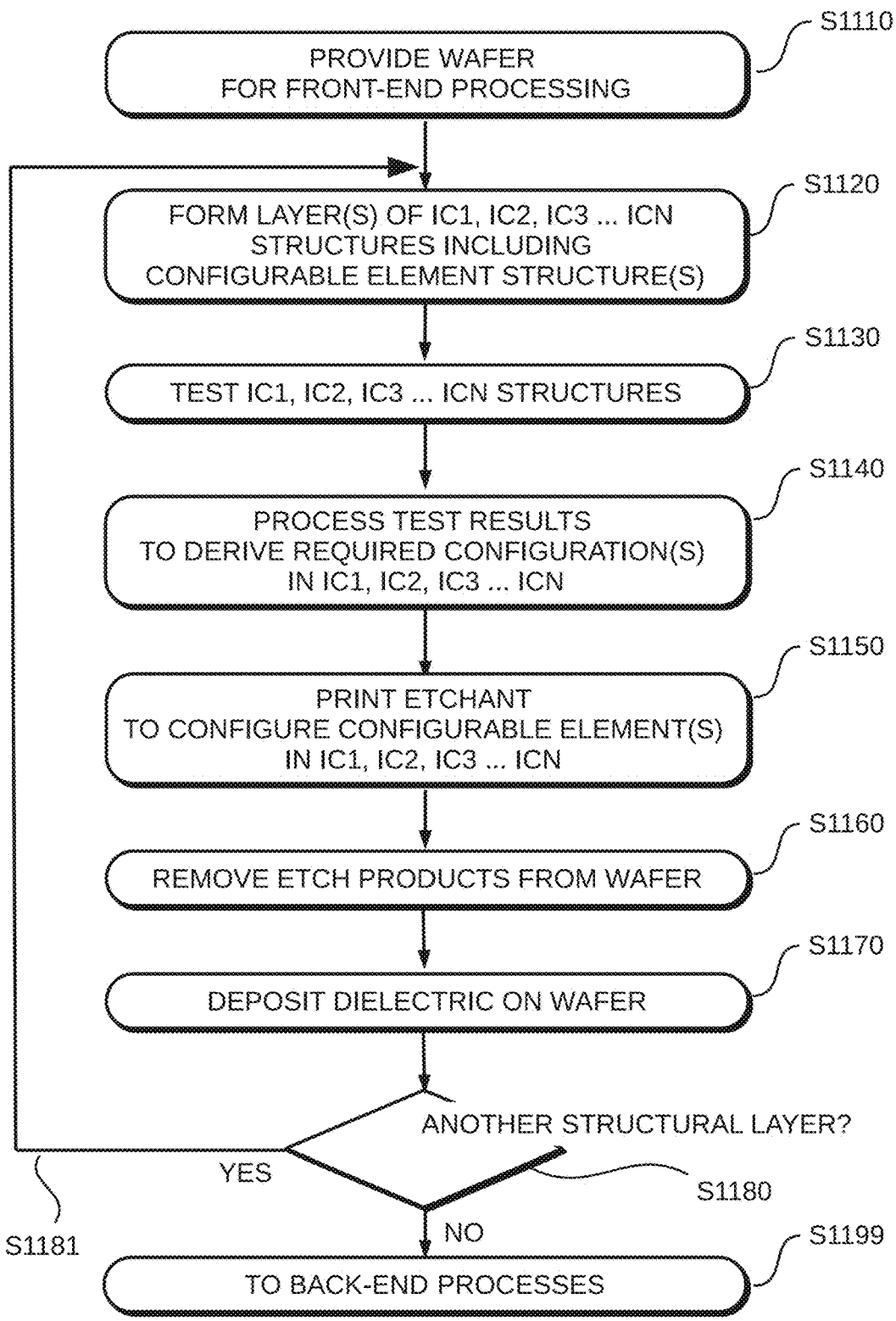
FIG. 11 illustrates a flowchart of a method for use in manufacturing semiconductor devices according to some embodiments.

FIG. 11 illustrates a flowchart of a method for use in manufacturing semiconductor devices according to some embodiments in another aspect encompassed by the invention. The method comprises, at S1110, providing a wafer, such as wafer 700 shown in FIG. 7, having a plurality of semiconductor device structures. For example, the semiconductor device structures are each to go into a different integrated circuit chip product IC1, IC2, IC3 . . . ICN. However, rather than making connections so as to individually configure the semiconductor device structures, as described above, in a variant method that will be described below, connections are broken to individually configure configurable circuit element structures comprised in the semiconductor device structures. Herein, a configurable circuit element structure that is prepared to be broken can also be referred to as fuse structure, fuse circuit, or, briefly, fuse.

At S1120, the method comprises forming semiconductor circuit structures, for example, integrated circuit IC1, IC2, IC3 . . . ICN structures in layers on the wafer. The structures may include configurable circuit element structure, that is, structural elements of at least one tuning element in one or more of the semiconductor device structures. For example, the integrated circuit IC1, IC2, IC3 . . . ICN structures can each include an array of landing patterns. In some embodiments, the method comprises configuring selected portions of the wafer to receive a liquid. The selected portions, in some embodiments, are those portions that comprise the configurable circuit element structure. In some embodiments, the act of configuring the wafer comprises forming the wafer surface with a recess to receive the liquid. In some implementations, guiding structures are formed on the wafer, for example, cavities and/or trenches that can be filled with etch solution. In some embodiments the guiding structures are configured to form a self-aligning system, for example, a funnel and/or a concave basin, wherein an effect of etch solution received on or in a structural element on a further spread of the etch solution is taken into account. At least one effect can be to increase an accuracy of etch processes described in more detail below in particular with regards to a location where etching is performed. In some embodiments, the act of configuring the wafer for receiving the liquid is performed prior to an act of testing the at least one semiconductor device structure that will be described next.

At S1130, the method comprises testing at least one of the semiconductor device structures in order to obtain information on the semiconductor device structures. In some embodiments, the information is based on the test result. For example, the information can be resistance values of resistive circuit elements of the semiconductor device structures.

At S1140, the method comprises processing the test results in order to derive a configuration that may be required for a desired functioning of the semiconductor devices to be manufactured from the wafer. In particular, in the example discussed herein, the configuration of the tuning elements as configurable circuit element structures in the integrated circuits IC1, IC2, IC3 . . . ICN can be derived, for example in order to achieve a same resistance value by compensation for variations in a measured resistance value from one semiconductor device to another. In some embodiments, the act of selectively providing the liquid on the selected portion of the wafer encodes information associated with the tested semiconductor device onto the wafer.

At S1150, based on a test result, a configurable circuit element structure of the semiconductor device structure can be selectively altered by providing the liquid on the selected portions of the wafer. Some embodiments of the method comprise ejecting the liquid from a reservoir, electrically charging the liquid, and controlling an electric field to direct the liquid. In some embodiments, the material to be deposited is a solution suitable for etching metals. In some embodiments, the liquid comprises an etchant. In some implementations, the solution is applied in a concentration that allows inkjet printing. In some embodiments the solution fulfills criteria such as viscosity, density, and surface tension for drop formation in a print head. Where the solution is reactive to dissolve metal, in particular metal of a fuse as disclosed herein, some embodiments use a solution of inorganic acid while other embodiments use a solution of an organic acid, for example, FeCl3 to dissolve a Cu fuse structure, or an organic base. Accordingly, the method comprises etching the at least one circuit element. In some embodiments, the circuit element is a conductor element. At least one effect can be to break an electrically conducting line provided by the conductor element. In some embodiments, each semiconductor device comprises an integrated circuit having a first circuit portion and a plurality of second circuit portions. In some embodiments, the altered circuit element keeps the first circuit portion from electrically connecting to a selected one of the plurality of second circuit portions. In a print application according to some implementations, drops (for example, in the range of 4-100 pL) are selectively placed at locations, where fuses have to be removed by etching. In some embodiments, the act of printing the etchant encompasses a reaction phase that lasts a certain time after the print application, for example, during an interval of a few minutes. During the reaction phase, etching can continue. Etching can be performed in a stable environment such as stable temperature and/or a stable humidity and having a predetermined gas atmosphere. In some implementations, a stable environment is provided in a closure formed by a reaction tunnel, cabinet or room. In some implementations, a transport structure such as a conveyer belt is provided that is configured to carry the workpiece, i.e., the wafer, through the closure. A speed of the conveyor can be adjusted to provide the required etching time on the wafer.

At S1160, etch products are removed from the wafer. For example, having traveled through the closure, the wafer is exposed to a treatment by a cleaning tool configured to remove etch solution and/or reaction products from the wafer. In some embodiments, the tool is provided as a spraying tool. At least one effect can be to rinse the wafer with water and/or solvent dispensed by the cleaning tool. In some implementations the wafer is then submitted to drying.

At S1170, in some embodiments, the dielectric is deposited on the wafer. In some embodiments, the dielectric is selectively provided on the selected portion of the wafer. At least one effect can be to passivate the at least one altered circuit element.

In sum, in some implementations, there is provided a method comprising providing a wafer having a plurality of semiconductor device structures, testing a semiconductor device structure destined to go into a chip, and, based on a test result, selectively altering a circuit element of the semiconductor device structure by providing a liquid on a selected portion of the wafer. At least one effect can be a selective breaking of one or more circuit connections. In some implementations, in a single semiconductor device structure the selected circuit connections similar, for example, to fuses in a bank of fuses all form a subset of circuit connections that are predetermined candidates for selective breaking.

In another aspect, the invention encompasses a wafer comprising a plurality of like semiconductor devices each having a plurality of circuit elements. A circuit element at a selected location within a first semiconductor device differs from another circuit element in the selected location within the another semiconductor device in that the circuit element within the first semiconductor device is resistive and formed as an etched recess, while the another circuit element is conductive. In some embodiments, the circuit element at the selected location within the first semiconductor device structure recedes below a top plane of the first semiconductor device structure.

In yet another aspect, the invention encompasses a die comprising a plurality of fuses comprising at least one opened fuse. In some embodiments, the plurality of fuses is arranged in an array. In some embodiments, a combination of fuses opened and not-opened represents a bit sequence. In the die, a break of electrical connection of the at least one opened fuse is formed by a concave wet etch crater. In some embodiments, for each fuse one fuse terminal is coupled to a common node for all of the plurality of fuses, while another fuse terminal is coupled to a sensor element associated with the fuse.

As described above, the act of working the wafer, at S1120, can comprise forming a cavity suitable to receive the substance. One example of an embodiment is: Forming a conductive line in a conductive layer, such as a metal line in a metal layer on a chip, providing an insulating layer above the conductive layer, and opening a window surrounding the interruption in the insulating layer covering this line.

Figure 12A:
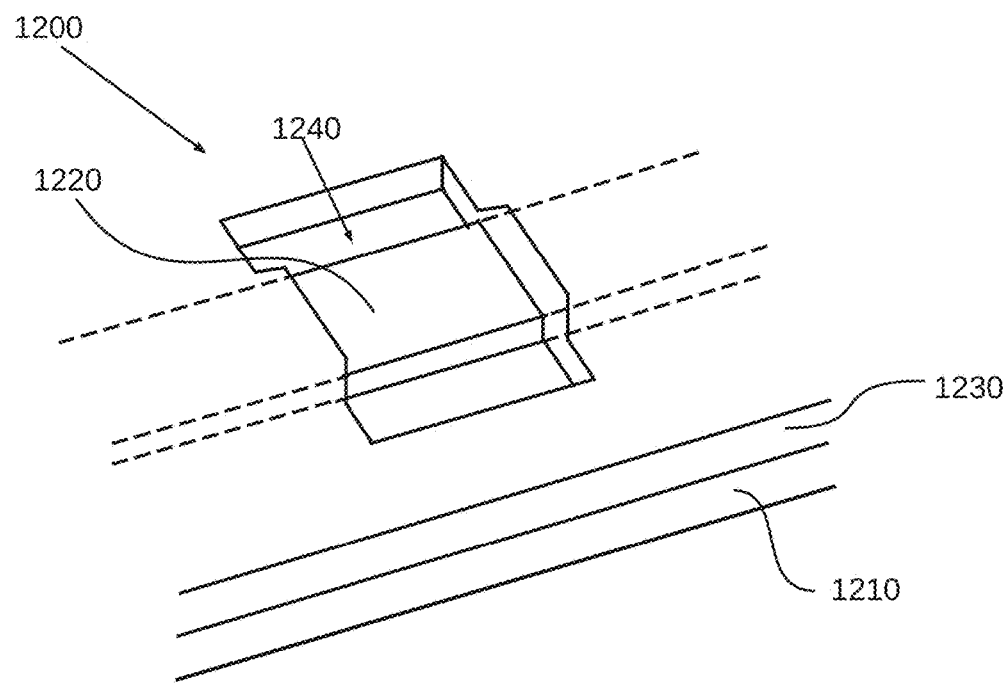
FIG. 12A and FIG. 12B illustrate a perspective view of a configurable circuit element structure according to some embodiments.
Figure 12B:
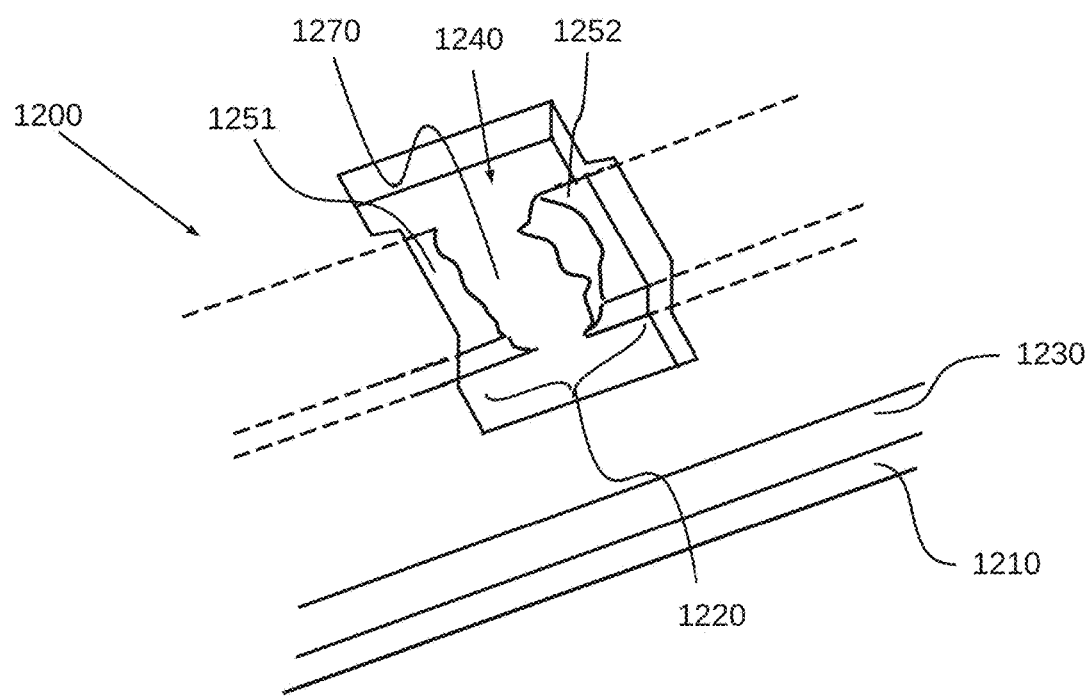

FIG. 12A illustrates a perspective view of a variant of the exemplary configurable circuit element structure illustrated in FIG. 2A. On a substrate 1210, a conductor line such as a metal line 1220 is provided. Atop the metal line 1220, an insulating layer 1230 is deposited. In the insulating layer 1230, a window 1240 is opened above the conductor line 1220. FIG. 12B illustrates another top view of the variant of the configurable circuit element structure illustrated in FIG. 12A, wherein the configurable circuit element structure is configured as presently described: In the window 1240, at the metal line 1220, etch substance has etched away a portion of the metal line 1220, whereby the metal line 1220 is broken into a first metal line and a second metal line that are coaxially aligned such that a terminal end 1251 of the first metal line faces a terminal end 1252 of the second metal line spaced apart from one another by a gap 1270. In some embodiments, the gap 1270 is approximately as large as the width of the metal line 1220. Thus, the ensemble of first metal line and second metal line forms an interrupted conductor line 1220. The terminal end 1251 of the first metal line 1221 and the terminal end 1252 of the second metal line 1222 are exposed within the window 1240. Thus, it should be understood that, even though reference is made to the circuit element as 'configurable', once the conductor line is interrupted to form the gap 1270 between the two terminal ends 1251 and 1252, the configurable circuit element is, in fact, configured. Later, for example at S1170, when depositing dielectric above the window 1240, the dielectric fills the gap 1270 and the ensemble of the two terminal ends 1251 and 1252 spaced apart by the gap 1270 filled with dielectric thus forms a high resistance element.

Figure 13A:
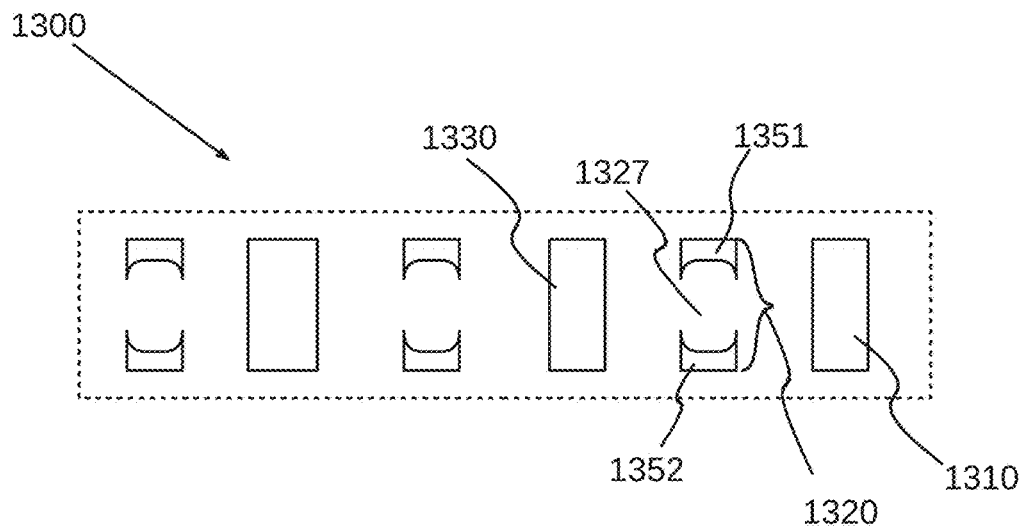
FIG. 13A and FIG. 13B illustrate a top view of a configurable circuit element structure according to some embodiments.

FIG. 13A illustrates a top view of a variant of the exemplary first configurable circuit element structure comprised in the exemplary first integrated circuit structure 711 of the wafer 700 in FIG. 7. The first configurable circuit element structure is provided as an array 1300 of conductor lines 1310, 1320, 1330, . . . to be digitally configurable. As described above with reference to FIGS. 12A and 12B, with the wafer 700 having been subjected to the method described with reference to FIG. 11, some of the conductor lines are broken. For example, conductor line 1320 has terminal ends 1321, 1322 that are spaced apart from one another by a gap 1327 and that can be electrically disconnected by a dielectric. It should be understood that, from one semiconductor device structure 711 to another 712 on the same wafer 700, a pattern of conductor lines 1310, 1330 and broken lines 1320 in the array 1300 can differ.

Figure 13B:
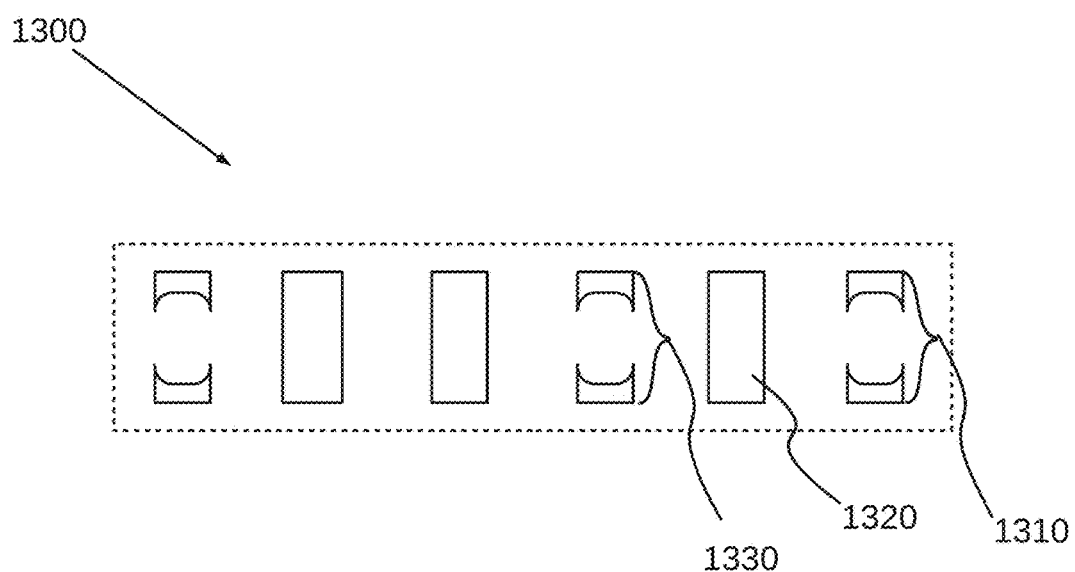

FIG. 13B illustrates a top view of the variant of the another example of the first configurable circuit element structure comprised in the exemplary second integrated circuit structure 712 of the wafer in FIG. 7. For example, while the first circuit element structure portion that forms part of the first integrated circuit structure 711, is shown in FIG. 13A to have a pattern of '010101' (wherein '0' represents 'broken line' and '1' represents 'intact conductor line'), the first circuit element structure portion that forms part of the second integrated circuit structure 712, as shown in FIG. 13B, has a different pattern of intact conductor lines 1320 and broken lines 1310, 1330 (in this example '011010'). In accordance with the present disclosure, a test can have been performed on the first integrated circuit structure 711, and the pattern '010101' of the first circuit element structure portion that forms part of the first integrated circuit structure 711 can be based on a result of that test. Since the test, when performed on the second integrated circuit structure 712, can have provided a different result, also the pattern to be formed with the array of terminal ends of the first circuit element structure portion that forms part of the second integrated circuit structure 712 can be different (as shown in FIG. 13B) from the pattern provided with the first integrated circuit structure 711.

Figure 14A:
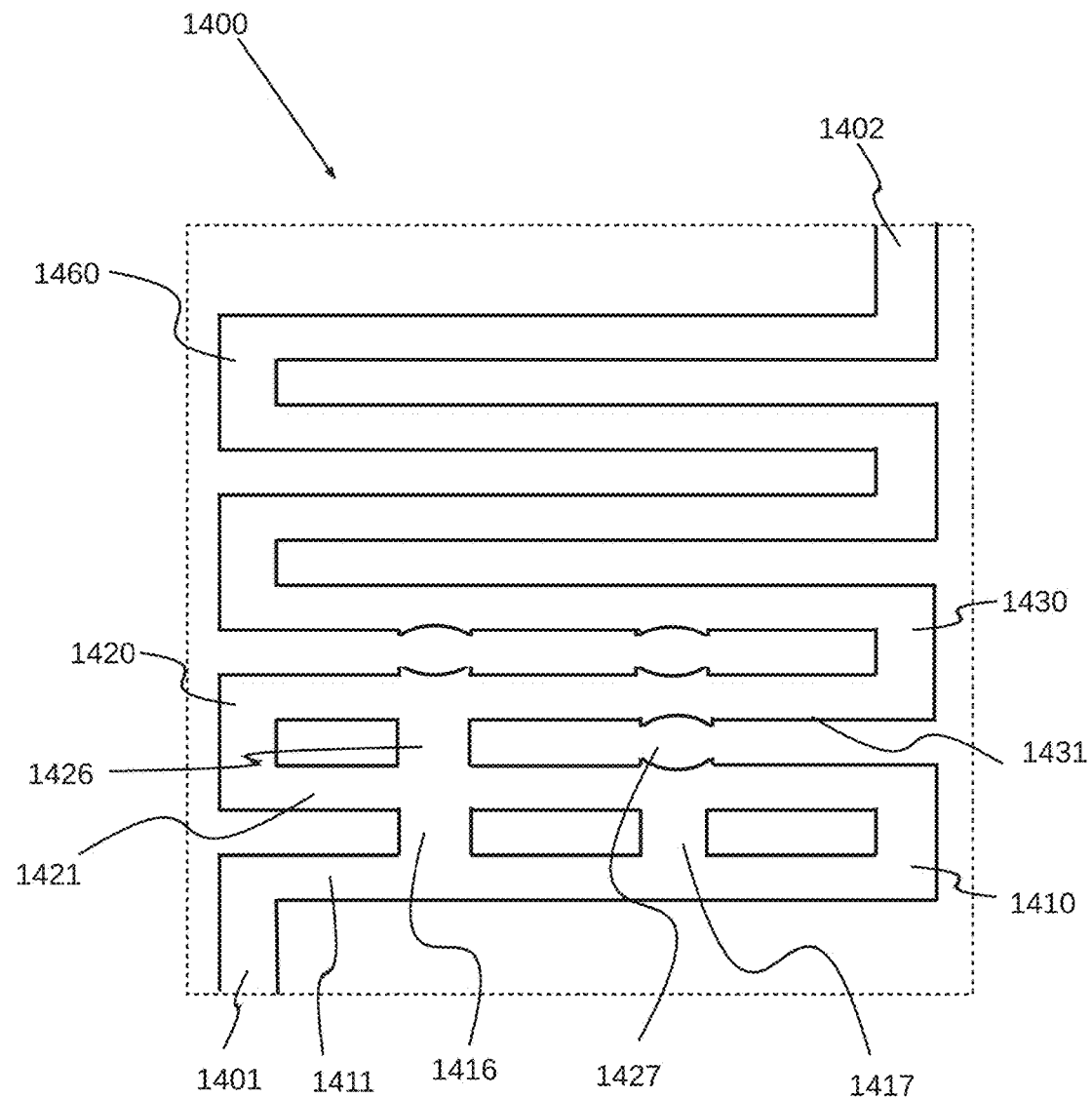
FIG. 14A and FIG. 14B illustrate a top view of another configurable circuit element structure according to some embodiments.

FIG. 14A illustrates a top view of a variant of the exemplary second configurable circuit element structure comprised in the first integrated circuit structure of the wafer in FIG. 7. The second configurable circuit element structure comprises an arrangement 1400 of a conductor line that runs from a first node 1401 to a second node 1402 and meanders in between the first node 1401 and the second node 1402. The conductor line forms meandering loops 1410, 1420, . . . , 1460. Further, the arrangement comprises conductor bridges 1416, 1417, 1426 that bridge a gap between two branches of a conductor loop, thereby short-circuiting at least some of the conductor loops. As described above with reference to FIG. 11, some of the bridges have been subjected to selective etching and have thus been removed. Between branches 1411 and 1421 of the loop 1410, all bridges 1416, 1417 were kept, effectively short-circuiting the conductor loop 1410 at bridge 1416. In contrast, between the branches 1421 and 1431 of the loop 1420, a first bridge at a location 1427 was selectively etched away in accordance with the method described above, whereby the short-circuit between the branches 1421 and 1431 at that location was removed. Merely a second bridge 1426 was left intact, where the second loop 1420 is short-circuited. At least one effect can be that the configurable circuit element structure is altered such that a resistance of the meandering conductor line in the arrangement 1400 is configured because of the selective removal of at least some of the short-circuits that reduce the length of the current path between the first node 1401 and the second node 1402. Other properties such as capacitance and/or inductance of the arrangement 1400 of the conductor line can also be altered. In accordance with the present disclosure, a test can have been performed on the first integrated circuit structure 711, and the presence and position of the selective etching can be based on a result of that test. Since the test, when performed on the second integrated circuit structure 712, can have provided a different result, also the presence and position of conductor bridges kept intact to effectively shorten the meandering conductor line could be different from the presence and position provided with the first integrated circuit structure 711.

Figure 14B:
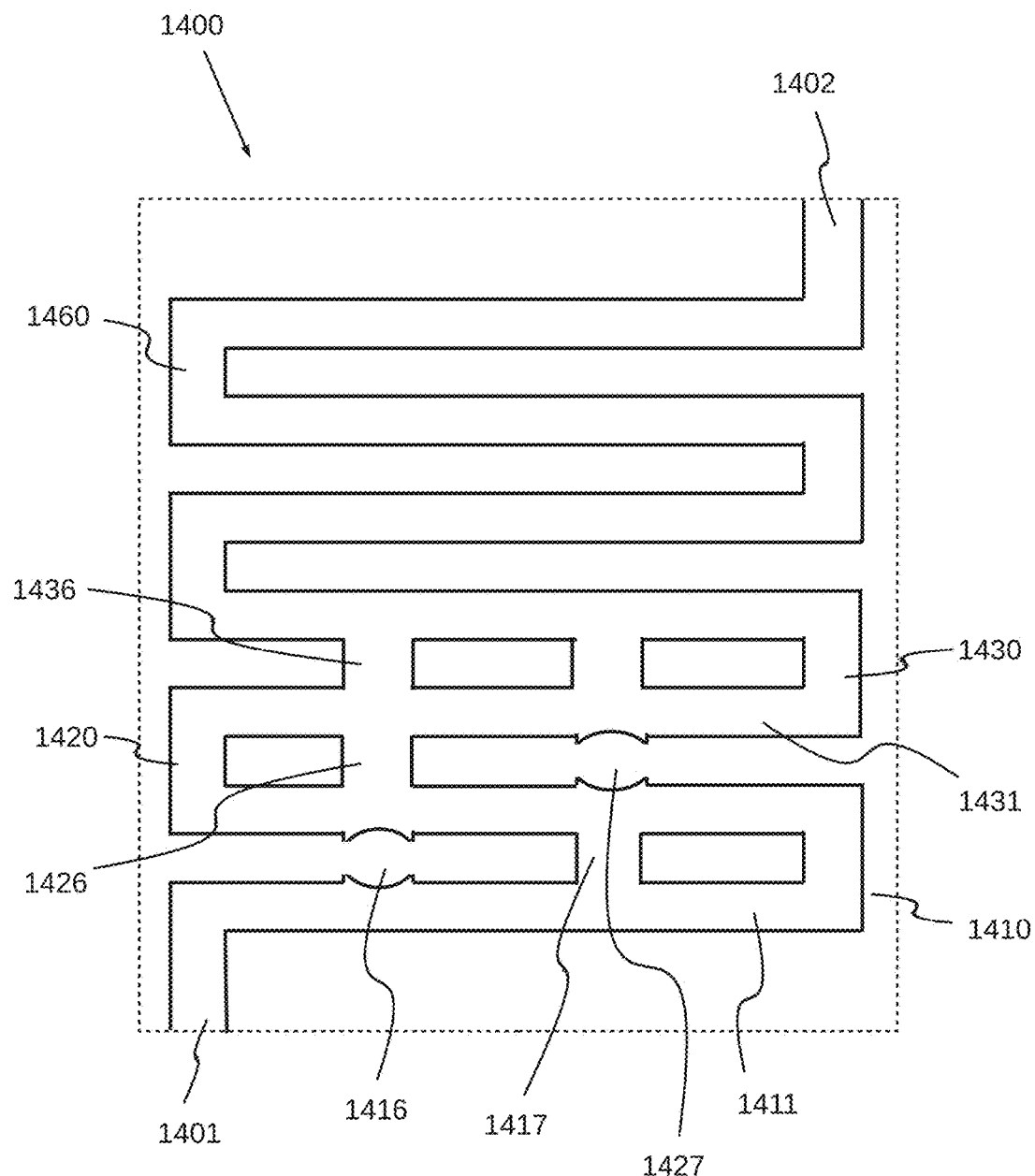

FIG. 14B illustrates a top view of the variant of the another example of the second configurable circuit element structure comprised in the exemplary second integrated circuit structure 712 of the wafer in FIG. 7, wherein the arrangement 1400 of the conductor line is the same as in FIG. 14A. However, the configuration of the second circuit element structure differs: While the first circuit element structure portion that forms part of the first integrated circuit structure 711, is shown in FIG. 14A with a conductor bridge at the location 1427 being etched away to remove one short-circuit in the second loop 1420 of the meandering conductor line, the second circuit element structure portion that forms part of the second integrated circuit structure 712, as shown in FIG. 14B, has two bridges at locations 1416 and 1427 etched away while three bridges 1417, 1426 and 1436 are kept to provide three short-circuits on the meandering conductor line to have etched away. In accordance with the present disclosure, a test can have been performed on the first integrated circuit structure 711, and the distribution pattern of removed conductor bridges 1416 and 1427 of the second circuit element structure portion that forms part of the first integrated circuit structure 711 can be based on a result of that test. Since the test, when performed on the second integrated circuit structure 712, could have provided a different result, also the distribution pattern of bridges to be etched away from the meandering conductor line of the second circuit element structure portion that forms part of the second integrated circuit structure 712 can be different (as shown in FIG. 14B) from the pattern provided with the first integrated circuit structure 711.

At least one effect of printing substance, based on tests performed on selected semiconductor devices formed on the wafer, in the process of manufacturing of semiconductor devices as described above can be to provide cost-effective and reliable alternative to apply both to already existing integrated circuit devices, e.g. structural phase transitions (SPT) fuses, as well as for future applications with greater added value in terms of utmost accuracy (e.g. current sensors).

Below, further implementations are disclosed.

In an aspect, the invention encompasses a method for use in manufacturing semiconductor devices comprising testing a wafer. The method further comprises, based on a test result, selectively providing a substance on the wafer to obtain an altered wafer. The altered wafer has at least one selected portion altered. The method further comprises adding a structural layer atop the altered wafer.

Some embodiments further comprise, prior to the act of testing the wafer, configuring a plurality of portions of the wafer so as to be altered. In some implementations, the act of selectively providing the substance on the wafer comprises selecting a subset of the plurality of portions for alteration.

In some embodiments, within a predetermined portion of the wafer, after the act of selectively providing the substance on the wafer, a subset of the plurality of portions for alteration together with other portions for alteration that are unaltered form a bit sequence that represents at least one value. In some embodiments, the act of selectively providing the substance on the wafer comprises selecting a location on the wafer where the providing a substance takes place In some embodiments, the wafer comprises a plurality of semiconductor device structures. The act of testing the wafer can comprise testing a semiconductor device structure.

In some embodiments, the act of selectively providing the substance on the wafer comprises selecting a semiconductor device structure where the providing the substance takes place.

In some embodiments, the plurality of semiconductor device structures each comprise circuit elements. The act of selectively providing the substance on the wafer can comprise selecting a circuit element comprised in the selected semiconductor device structure where the providing the substance takes place. Thus, the portions for alteration each include at least one configurable circuit element structure.

In some embodiments, the circuit element selected for providing the substance is passive. In some embodiments, the circuit element is a connection and the substance breaks the connection. In some embodiments, the circuit element is a pair of terminals separated by a dielectric and the substance makes a connection between the terminals across the dielectric.

In some embodiments, the circuit element selected for alteration is active.

Some embodiments further comprise processing a test result from testing the wafer to obtain control data. In some embodiments, the method further comprises using the control data in the act of providing the substance on the wafer.

In some embodiments, the substance is a conductive material. In some embodiments, the substance, at the time of the act of providing the substance, is a paste.

In some embodiments, the substance is an etch material. In some embodiments, the substance, at the time of the act of providing the substance, is at least one selected from the group consisting of a liquid and a suspension in a liquid.

In some embodiments, the method further comprises ejecting the liquid from a reservoir. The liquid can be electrically charged. The method can comprise controlling an electric field to direct the liquid onto the wafer.

In some embodiments, the method comprises providing the liquid in a cavity having a nozzle and ejecting liquid through the nozzle. In some embodiments, the method comprises increasing a pressure inside the cavity. At least one effect can be that, via the nozzle, liquid can get ejected from the cavity. In some embodiments, the act of increasing the pressure comprises reducing a cavity volume and/or heating the liquid inside the cavity.

In some embodiments, the act of adding the structural layer atop the altered wafer completes formation of a plurality of semiconductor devices that are functionally identical, while at least one semiconductor device differs from the other semiconductor devices in a parameter setting.

In some embodiments, each semiconductor device comprises an integrated circuit having a first circuit portion and a plurality of second circuit portions, wherein the altered circuit element keeps the first circuit portion from electrically connecting to a selected one of the plurality of second circuit portions.

Since other modifications and changes varied to fit particular operating requirements and environments will be apparent to those skilled in the art, the invention is not considered limited to the example chosen for the purposes of disclosure, and covers all changes and modifications which do not constitute departures from the true spirit and scope of this invention. In particular, it should be understood that, in the manufacturing process of semiconductor devices, in particular where the semiconductor devices are integrated circuits, but not limited to ICs, the methods according to the invention in different aspects described herein ('making connections' and 'breaking connections') can be used either one or the other, or both, at different stages of processing the wafer, for example to configure circuit element structures in different locations and/or layers of the semiconductor devices.

Permanently storing digital information in a chip can be achieved by changing the physical characteristics of a structure from one "state" to another, and one way of doing it is by the use of a Laser-pulse. There are a number of conventional ways of permanently modifying the electrical and physical characteristics of semiconductor devices and other structures using a Laser impulse. To state a common example a normally low ohmic path for current flow can be interrupted by transforming it into a very highly ohmic path (ideally, by a transition from a "short-circuit" to an "open-circuit"). In this way, by cutting or not-cutting selected "paths" in a group of paths, it is possible to memorize a string of bits, whose values can be electrically read by a read circuitry configured to perform the read.

As used herein, a logical state of "0" (herein also briefly referred to as logical "0") corresponds to the physical condition "short-circuit", which thus represents logical "0"; and a logical state of "1" (herein also briefly referred to as logical "1") corresponds to the physical condition "open-circuit", which thus represents logical "1". It should be understood that the representation of logical "0" and "1" by short-circuit and open-circuit elements, respectively, is a matter of convention and/or choice of the person skilled in the art, unless other technical considerations that are expressly mentioned require otherwise and thus predetermine the representation. In particular, a process technology used in manufacturing the semiconductor device can predetermine, if a conductive path is formed to represent logical 0 or logical 1. Also other more general requirements can be listed: in some implementations, the "conductive path" should be: low-ohmic (to essentially form a "short-circuit"), easy to interrupt by using a Laser impulse, once it was "cut" by the Laser impulse reliably operative as an open-circuit element, so as to achieve, for example, a long data retention time of the "open-circuit"; and reliable as short-circuit element when "not-cut" so as to achieve, for example, a long data retention time of the "short-circuit".

As used herein, a "blob" can be a droplet or a short line formed, for example, by setting a small amount of liquid to a surface or by providing a small amount of paste to a surface. In this connection, 'small' means that gravity is a force that essentially can be neglected in the context of the present techniques when compared to surface tension and other forces inherent to the body of the blob.

As used herein, the wording 'semiconductor device structure' can relate to a semiconductor device in a finished wafer. The term also encompasses a portion of a semiconductor device that is completed in a manufacturing process, while the manufacturing process is not yet completed, that is, manufacturing of the wafer is not yet completed. In other words, the semiconductor device structure can also denote a semiconductor device under construction and, hence, not necessarily a finished semiconductor device.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

The implementations herein are described in terms of exemplary embodiments. However, it should be appreciated that individual aspects of the implementations may be separately claimed and one or more of the features of the various embodiments described herein may be combined with each other, unless specifically noted otherwise. In some instances, well-known features are omitted or simplified to clarify the description of the exemplary implementations.

The order in which the embodiments/implementations and methods/processes are described is not intended to be construed as a limitation, and any number of the described implementations and processes may be combined.

As used herein, the terms 'having', 'containing', 'including', 'with' or variants thereof, and like terms are open ended terms intended to be inclusive. These terms indicate the presence of stated elements or features, but do not preclude additional elements or features.

As used herein, directional terminology, such as 'top', 'bottom', 'front', 'back', etc., is used with reference to the orientation of the figure(s) being described.

As used herein, terms such as 'first', 'second', and the like, are also used to describe various elements, regions, sections, etc. and are also not intended to be limiting, unless expressly stated otherwise.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

The invention claimed is:

1. A die, comprising:
a plurality of dielectric landings, wherein each one of the plurality of dielectric landings electrically separates two conductive landings associated with the one of the plurality of dielectric landings, wherein the two conductive landings include a first terminal end of a first metal line and a second terminal end of a second metal line, and wherein a dielectric layer over the first metal line and the second metal line includes a window that exposes the first terminal end and the second terminal end; and
a conductive material distributed inside the window of one or more of the plurality of dielectric landings, wherein the conductive material establishes an electrical connection between the first terminal end and the second terminal end of the two conductive landings associated with the one or more of the plurality of dielectric landings, and wherein a surface of the conductive material over the first terminal end and the second terminal end is below a top surface of the dielectric layer over the first metal line and the second metal line.

2. The die of claim 1, wherein the plurality of dielectric landings are arranged in an array, and wherein the conductive material is distributed to represent a bit sequence.

3. A die, comprising:
a plurality of dielectric landings, wherein each one of the plurality of dielectric landings electrically separates two conductive landings associated with the one of the plurality of dielectric landings; and
a conductive material distributed across one or more of the plurality of dielectric landings, wherein the conductive material establishes an electrical connection between the two conductive landings associated with the one or more of the plurality of dielectric landings, wherein the plurality of dielectric landings electrically separate conductive branches within loops of a conductive line, and wherein the conductive material is configured to reduce a length of a current path between a first node and the second node of the conductive line.

4. The die of claim 3, wherein reducing a length of the current path of the conductive line reduces one or more of a resistance, a capacitance or an inductance of the conductive line between the first node and the second node.

5. The die of claim 4, wherein the die includes a sensor element, and wherein one or both of the first node and the second node are electrically coupled to the sensor element.

6. The die of claim 1, wherein a surface of the conductive material has a convex cross-section, and wherein the surface of the conductive material is elevated above a plane of the two conductive landings.

7. A die, comprising:
a plurality of configurable circuit elements, wherein each one of the plurality of configurable circuit elements includes a first metal line and a second metal line that are on a substrate and spaced apart and electrically separated by a gap, wherein a dielectric layer is over the first metal line and the second metal line, and wherein the dielectric layer includes a window that exposes a terminal end portion of the first metal line and a terminal end portion of the second metal line; and
a conductive material distributed inside the window of one or more of the plurality of configurable circuit elements, wherein the conductive material establishes an electrical connection between the terminal end portion of the first metal line and the terminal end portion of second metal line of the one or more of the plurality of configurable circuit elements, and wherein a surface of the conductive material over the terminal end portion of the first metal line and the terminal end portion of the second metal line is below a top surface of the dielectric layer over the first metal line and the second metal line.

8. The die of claim 7, wherein a surface of the conductive material has a convex cross-section in a direction that is along a longitudinal axis of the first metal line and the second metal line.

9. A die, comprising:
a plurality of configurable circuit elements, wherein each one of the plurality of configurable circuit elements includes a first metal line and a second metal line that are on a substrate and spaced apart by a gap and a dielectric layer that is over the first metal line and the second metal line, wherein the dielectric layer includes a window that exposes a terminal end portion of the first metal line and a terminal end portion of the second metal line; and
a conductive material distributed across one or more of the plurality of configurable circuit elements, wherein the conductive material establishes an electrical connection between the terminal end portion of the first metal line and the terminal end portion of second metal line of the one or more of the plurality of configurable circuit elements,
wherein a surface of the conductive material has a convex cross-section in a direction that is along a longitudinal axis of the first metal line and the second metal line, and
wherein a surface of the conductive material has a convex cross-section in a direction that is orthogonal to the longitudinal axis of the first metal line and the second metal line.

10. The die of claim 7, wherein the plurality of configurable circuit elements are arranged in an array, and wherein the conductive material is distributed to represent a bit sequence.

11. A die, comprising:
a plurality of configurable circuit elements, wherein each one of the plurality of configurable circuit elements includes a first metal line and a second metal line that are on a substrate and spaced apart by a gap and a dielectric layer that is over the first metal line and the second metal line, wherein the dielectric layer includes a window that exposes a terminal end portion of the first metal line and a terminal end portion of the second metal line; and
a conductive material distributed across one or more of the plurality of configurable circuit elements, wherein the conductive material establishes an electrical connection between the terminal end portion of the first metal line and the terminal end portion of second metal line of the one or more of the plurality of configurable circuit elements, wherein the plurality of configurable circuit elements electrically separate conductive branches within loops of a conductive line, and wherein the conductive material is configured to reduce a length of a current path between a first node and the second node of the conductive line.

12. The die of claim 11, wherein reducing a length of the current path of the conductive line reduces one or more of a resistance, a capacitance or an inductance of the conductive line between the first node and the second node.

* * * * *